(12) United States Patent
Rokkam et al.

(10) Patent No.: US 11,961,756 B2
(45) Date of Patent: Apr. 16, 2024

(54) VENTED SUSCEPTOR

(71) Applicant: ASM IP HOLDING BV, Almere (NL)

(72) Inventors: Uday Kiran Rokkam, San Diego, CA (US); Sam Kim, Chandler, AZ (US); Saket Rathi, Tempe, AZ (US); Dakai Bian, Tempe, AZ (US)

(73) Assignee: ASM IP Holding B.V., Almere (NL)

( * ) Notice: Subject to any disclaimer, the term of this patent is extended or adjusted under 35 U.S.C. 154(b) by 167 days.

(21) Appl. No.: 16/744,063

(22) Filed: Jan. 15, 2020

(65) Prior Publication Data

US 2020/0234996 A1    Jul. 23, 2020

Related U.S. Application Data

(60) Provisional application No. 62/793,852, filed on Jan. 17, 2019.

(51) Int. Cl.
    *H01L 21/687*    (2006.01)
(52) U.S. Cl.
    CPC .... *H01L 21/68735* (2013.01); *H01L 21/6875* (2013.01); *H01L 21/68785* (2013.01)
(58) Field of Classification Search
    CPC ........... H01L 21/68735; H01L 21/6875; H01L 21/68785
    USPC ........................................................ 118/728
    See application file for complete search history.

(56) References Cited

U.S. PATENT DOCUMENTS

| | | |
|---|---|---|
| 3,407,783 A | 10/1968 | Capita |
| 3,549,847 A | 12/1970 | Clark et al. |
| 3,641,974 A | 2/1972 | Yamada et al. |
| 3,796,182 A | 3/1974 | Rosler |
| 4,499,354 A | 2/1985 | Hill et al. |
| 4,522,149 A | 12/1985 | Garbis et al. |
| 4,560,420 A | 12/1985 | Lord |
| 4,710,428 A | 12/1987 | Tamamizu et al. |
| 4,821,674 A | 4/1989 | deBoer et al. |
| 4,958,061 A | 12/1990 | Wakabayashi et al. |
| 4,978,567 A | 12/1990 | Miller |
| 4,986,215 A | 1/1991 | Yamada et al. |

(Continued)

FOREIGN PATENT DOCUMENTS

| | | |
|---|---|---|
| CN | 102308362 | 1/2012 |
| CN | 103733327 | 4/2014 |

(Continued)

OTHER PUBLICATIONS

"Shaping the Future in Semiconductor Processing." Advertisement for Morton International, Inc., *Ceramic Solutions*. vol. 73, No. 7, Jul. 1994: advertisements (circa 1993).

*Primary Examiner* — Charlee J. C. Bennett
(74) *Attorney, Agent, or Firm* — Banner & Witcoff, Ltd.

(57) ABSTRACT

A susceptor can include a generally circular shape and may include an inner and outer susceptor. The outer susceptor can include a support region having one or more support mechanisms as well as a channel region extending from the region boundary to an outer radial boundary radially inward of an outer edge of the susceptor, the channel region can include a plurality of channels extending radially from the region boundary to the outer radial boundary. The inner susceptor can include a second plurality of channels extending from the inner radial boundary to an edge of the inner susceptor.

14 Claims, 19 Drawing Sheets

(56) References Cited

U.S. PATENT DOCUMENTS

| | | | |
|---|---|---|---|
| 4,990,374 A | 7/1991 | Keeley et al. |
| 5,033,407 A | 9/1991 | Mizuno et al. |
| 5,044,943 A | 9/1991 | Bowman et al. |
| 5,071,670 A | 12/1991 | Kelly |
| 5,074,017 A | 12/1991 | Toya et al. |
| 5,098,198 A | 3/1992 | Nulman et al. |
| 5,108,792 A | 4/1992 | Anderson et al. |
| 5,119,540 A | 6/1992 | Kong et al. |
| 5,119,541 A | 6/1992 | Ohmi et al. |
| 5,121,531 A | 6/1992 | Severns et al. |
| 5,156,820 A | 10/1992 | Wong et al. |
| 5,188,501 A | 2/1993 | Tomita et al. |
| 5,199,483 A | 4/1993 | Bahng |
| 5,200,157 A | 4/1993 | Toya et al. |
| 5,242,501 A | 9/1993 | McDiarmid |
| 5,292,554 A | 3/1994 | Sinha et al. |
| 5,298,465 A | 3/1994 | Levy |
| 5,304,248 A | 4/1994 | Cheng et al. |
| 5,306,699 A | 4/1994 | Eddy |
| 5,308,645 A | 5/1994 | Zachman et al. |
| 5,332,442 A | 7/1994 | Kubodera et al. |
| 5,343,938 A | 9/1994 | Schmidt |
| 5,354,715 A | 10/1994 | Wang et al. |
| 5,356,486 A | 10/1994 | Sugarman et al. |
| 5,370,739 A | 12/1994 | Foster et al. |
| 5,383,971 A | 1/1995 | Selbrede |
| 5,393,349 A | 2/1995 | Ohkase |
| 5,403,401 A | 4/1995 | Haafkens et al. |
| 5,421,893 A | 6/1995 | Perlov |
| 5,427,620 A | 6/1995 | deBoer et al. |
| 5,444,217 A | 8/1995 | Moore et al. |
| 5,455,069 A | 10/1995 | Lee |
| 5,456,757 A | 10/1995 | Aruga et al. |
| 5,461,214 A | 10/1995 | Peck et al. |
| 5,467,220 A | 11/1995 | Xu |
| 5,492,566 A | 2/1996 | Sumnitsch |
| 5,514,439 A | 5/1996 | Sibley |
| 5,516,367 A | 5/1996 | Lei et al. |
| 5,527,393 A | 6/1996 | Sato et al. |
| 5,549,756 A | 8/1996 | Sorensen et al. |
| 5,551,985 A | 9/1996 | Brors et al. |
| 5,558,717 A | 9/1996 | Zhao et al. |
| 5,583,736 A * | 12/1996 | Anderson ............... H02N 13/00 279/128 |
| 5,584,936 A | 12/1996 | Pickering et al. |
| 5,588,827 A | 12/1996 | Muka |
| 5,620,525 A | 4/1997 | van de Ven et al. |
| 5,645,646 A | 7/1997 | Beinglass et al. |
| 5,656,093 A | 8/1997 | Burkhart et al. |
| 5,683,518 A | 11/1997 | Moore et al. |
| 5,690,742 A | 11/1997 | Ogata et al. |
| 5,700,725 A | 12/1997 | Hower et al. |
| 5,738,165 A | 4/1998 | Imai |
| 5,761,023 A | 6/1998 | Lue et al. |
| 5,800,622 A | 9/1998 | Takemi et al. |
| 5,803,977 A | 9/1998 | Tepman et al. |
| 5,834,737 A | 11/1998 | Hirose et al. |
| D404,370 S | 1/1999 | Kimura |
| 5,895,530 A | 4/1999 | Shrotriya et al. |
| 5,938,850 A | 8/1999 | Arami et al. |
| 5,960,159 A | 9/1999 | Ikeda et al. |
| 6,001,183 A | 12/1999 | Gurary et al. |
| 6,020,212 A | 2/2000 | Mathis |
| 6,068,441 A | 5/2000 | Raaijmakers et al. |
| 6,077,357 A | 6/2000 | Rossman et al. |
| 6,086,680 A | 7/2000 | Foster et al. |
| 6,090,212 A | 7/2000 | Mahawili |
| 6,093,252 A | 7/2000 | Wengert et al. |
| 6,167,834 B1 | 1/2001 | Wang et al. |
| 6,293,749 B1 | 9/2001 | Raaijmakers et al. |
| 6,325,858 B1 | 12/2001 | Wengert et al. |
| 6,331,023 B1 | 12/2001 | Goodwin et al. |
| 6,343,183 B1 | 1/2002 | Halpin et al. |
| 6,394,797 B1 | 5/2002 | Sugaya et al. |
| 6,402,850 B1 | 6/2002 | Beinglass et al. |
| 6,464,790 B1 | 10/2002 | Sherstinsky et al. |
| 6,608,287 B2 | 8/2003 | Halpin et al. |
| 6,634,882 B2 | 10/2003 | Goodman |
| 6,709,267 B1 | 3/2004 | Hawkins et al. |
| D496,008 S | 9/2004 | Takahashi et al. |
| 6,893,507 B2 | 5/2005 | Goodman et al. |
| 7,033,445 B2 | 4/2006 | Keeton et al. |
| D525,127 S | 7/2006 | Cogley et al. |
| D600,223 S | 9/2009 | Aggarwal et al. |
| 7,601,224 B2 | 10/2009 | Foree |
| 7,602,224 B2 | 10/2009 | Foree |
| 7,648,579 B2 | 1/2010 | Goodman et al. |
| 7,722,441 B2 | 5/2010 | Goela et al. |
| 7,740,703 B2 | 6/2010 | Hasegawa et al. |
| 8,088,225 B2 | 1/2012 | Goodman et al. |
| 8,287,648 B2 | 10/2012 | Reed et al. |
| 8,366,830 B2 | 2/2013 | Nakamura et al. |
| 8,394,229 B2 | 3/2013 | Aggarwal et al. |
| 8,801,857 B2 | 8/2014 | Aggarwal et al. |
| 8,826,769 B2 * | 9/2014 | Takezawa ............... B62D 1/189 280/778 |
| D743,357 S | 11/2015 | Vyne |
| 9,558,985 B2 | 1/2017 | Wang et al. |
| D784,276 S | 4/2017 | Tiner et al. |
| 9,633,889 B2 | 4/2017 | Cuvalci et al. |
| 10,068,791 B2 | 9/2018 | Parsey, Jr. et al. |
| D830,981 S | 10/2018 | Jeong et al. |
| 10,242,890 B2 | 3/2019 | Volfovski et al. |
| 10,376,916 B2 | 8/2019 | Ranish et al. |
| D864,134 S | 10/2019 | Watarai et al. |
| D914,620 S * | 3/2021 | Rokkam ..................... D13/182 |
| 11,018,047 B2 | 5/2021 | Rokkam et al. |
| D920,936 S * | 6/2021 | Rokkam ..................... D13/182 |
| 2002/0011211 A1 | 1/2002 | Halpin |
| 2002/0043337 A1* | 4/2002 | Goodman .......... H01L 21/68728 156/345.12 |
| 2002/0189940 A1 | 12/2002 | Tsai et al. |
| 2003/0000472 A1 | 1/2003 | Lim et al. |
| 2003/0049580 A1 | 3/2003 | Goodman |
| 2004/0060512 A1 | 4/2004 | Waldhauer et al. |
| 2004/0229002 A1 | 11/2004 | Davis et al. |
| 2005/0092439 A1 | 5/2005 | Keeton et al. |
| 2005/0284372 A1 | 12/2005 | Murugesh et al. |
| 2006/0057826 A1 | 3/2006 | De Boer |
| 2009/0280248 A1 | 11/2009 | Goodman et al. |
| 2010/0031884 A1 | 2/2010 | Aggarwal et al. |
| 2010/0107974 A1 | 5/2010 | Givens et al. |
| 2013/0109192 A1 | 5/2013 | Hawkins et al. |
| 2016/0002778 A1 | 1/2016 | Ravi et al. |
| 2016/0068996 A1* | 3/2016 | Lau ..................... C23C 16/4584 118/728 |
| 2016/0133504 A1* | 5/2016 | Chu ..................... C23C 16/4583 165/146 |
| 2017/0175265 A1* | 6/2017 | Shah ..................... C23C 16/4583 |
| 2018/0094350 A1 | 4/2018 | Verghese et al. |
| 2019/0355612 A1 | 11/2019 | Sakurai |
| 2020/0234996 A1 | 7/2020 | Rokkam et al. |
| 2020/0373187 A1 | 11/2020 | Singu et al. |
| 2021/0125853 A1* | 4/2021 | Rathi ..................... H01L 21/2686 |

FOREIGN PATENT DOCUMENTS

| | | |
|---|---|---|
| CN | 106463365 | 2/2017 |
| EP | 0339279 | 11/1989 |
| EP | 0448346 | 3/1991 |
| EP | 0445596 | 9/1991 |
| EP | 0634785 | 1/1995 |
| EP | 0669640 | 8/1995 |
| EP | 0766289 | 4/1997 |
| EP | 0840358 | 5/1998 |
| GB | 2181458 A | 4/1987 |
| JP | 7-58039 | 3/1995 |
| JP | 2000-269310 | 9/2000 |
| JP | 2002-184843 | 6/2002 |
| JP | 2002-526915 | 8/2002 |
| JP | 2003-124167 | 4/2003 |
| JP | 2006-228802 | 8/2006 |
| JP | 2007-502022 | 2/2007 |

(56) References Cited

FOREIGN PATENT DOCUMENTS

| | | |
|---|---|---|
| JP | D1422195 | 8/2014 |
| JP | D1547357 | 4/2016 |
| JP | D1570747 | 2/2018 |
| JP | D1570748 | 2/2018 |
| KR | 10-1999-0069084 | 9/1999 |
| KR | 1999-0069091 | 9/1999 |
| KR | 100460338 B1 | 11/2004 |
| KR | 10-2007-0098025 | 10/2007 |
| TW | D111900 | 7/2006 |
| TW | D136587 | 8/2010 |
| TW | 201724397 A | 7/2017 |
| TW | D184695 | 8/2017 |
| TW | D191199 | 6/2018 |
| WO | WO 96/30713 | 10/1996 |
| WO | WO 97/08743 | 3/1997 |
| WO | WO 2010/016964 | 2/2010 |

\* cited by examiner

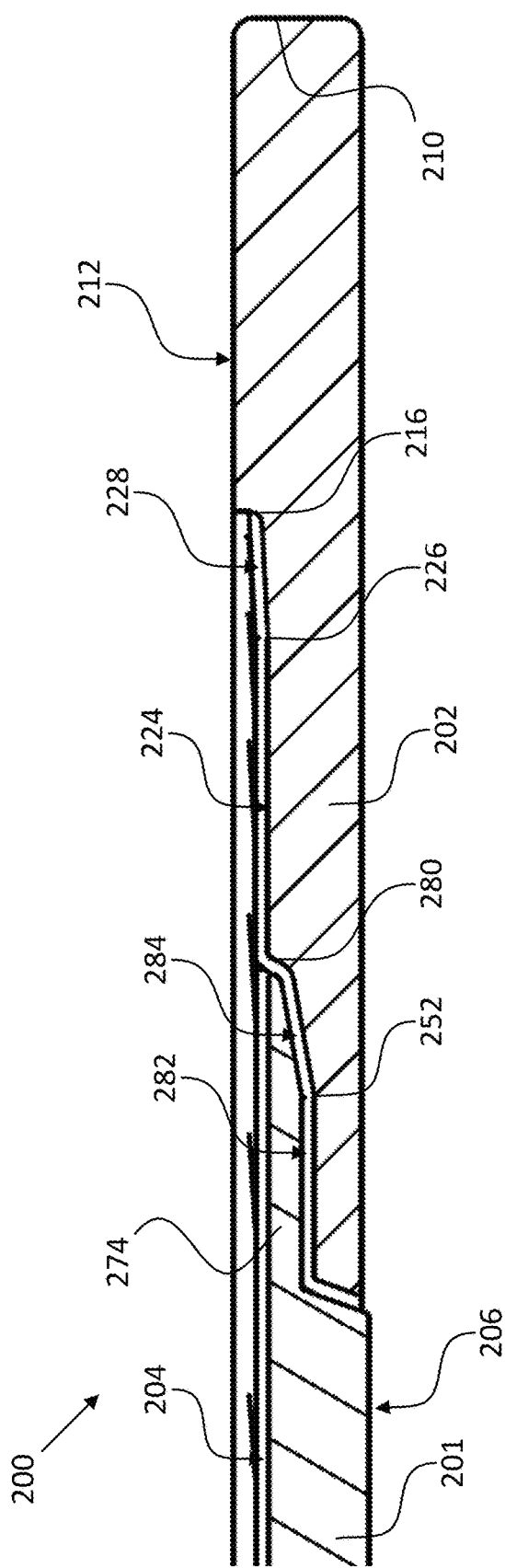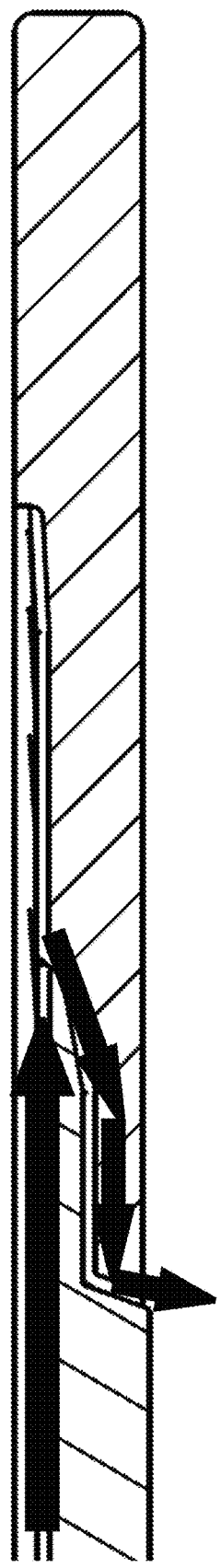
FIG. 19
FIG. 20

VENTED SUSCEPTOR

CROSS-REFERENCE TO RELATED APPLICATIONS

This application claims the benefit of priority to U.S. Provisional Application No. 62/793,852, filed Jan. 17, 2019, titled VENTED SUSCEPTOR, which is hereby incorporated by reference herein in its entirety. Any and all applications for which a foreign or domestic priority claim is identified in the Application Data Sheet as filed with the present application are hereby incorporated by reference under 37 CFR 1.57.

BACKGROUND

Field of the Disclosure

This disclosure relates generally to semiconductor processing, and more particularly to susceptors for supporting semiconductor substrates in process chambers.

Description of the Related Art

Semiconductor fabrication processes are typically conducted with the substrates supported within a reaction chamber on a susceptor under controlled process conditions. For many processes, semiconductor substrates (e.g., wafers) are heated inside the reaction chamber. A number of quality control issues related to the physical interaction between the substrate and the susceptor can arise during processing.

SUMMARY

In some embodiments, a susceptor is provided. The susceptor can include a face that is configured to support a substrate thereon; an outer edge forming an outer perimeter around the face; a back surface opposite the face. The face can include: a channel region positioned between an the outer edge and a center of the face; and a plurality of channels disposed within the channel region and extending radially relative to the center of the face. The susceptor can include one or more apertures extending between the face and the back surface, the one or more apertures configured to allow for pins to extend therethrough and lift a substrate from the face of the susceptor, the one or more apertures disposed within the channel region.

In some embodiments, the face further comprises a radially extending substantially flat and smooth rim region between the outer edge and an outer radial boundary of the channel region. A cross section of at least one of the plurality of channels can include first and second sidewalls, each of the first and second sidewalls being substantially flat. The first and second sidewalls can be disposed at an acute angle relative to each other.

In some embodiments, each of the plurality of channels is substantially straight in a radial direction, and wherein an angular separation between first and second channels of the plurality of channels is greater than an angular separation between the second and a third channel of the plurality of channels, wherein the first channel is radially consecutive with the second channel and the second channel is radially consecutive with the third channel. In some embodiments, the angular separation between the first and second channels is at least about 50% greater than the angular separation between the second and third channels. In some embodiments, the one or more apertures is disposed between the first and second channels.

In some embodiments, the one or more apertures comprises at least three apertures, and wherein an angular separation between each radially consecutive aperture of the at least three apertures is substantially equal. In some embodiments, the channel region comprises an outer channel region and an inner channel region, wherein the outer channel region has an elevated portion relative to the inner channel region, the outer channel region configured to support the substrate. In some embodiments, the number of channels within the channel region of the face is between 15 and 30.

In some embodiments, a susceptor includes an outer susceptor configured to support a substrate, the outer susceptor comprising: a generally round edge; an aperture; and a first channel region positioned between the edge of the outer susceptor and the aperture to form a generally annular ring, the first channel region comprising a first plurality of radially extending channels; and an inner susceptor configured to be supported by the outer susceptor in an assembled state, the inner susceptor comprising: a generally round edge; and a second channel region positioned between a center and the edge of the inner susceptor, the second channel region comprising a second plurality of radially extending channels.

In some embodiments, a cross section of at least one of the first plurality of channels comprises curvilinear sidewalls. In some embodiments, each of the first and second plurality of channels is substantially straight in a radial direction, and wherein, in the assembled state, the each of the first plurality of channels is substantially collinear with corresponding channels of the second plurality of channels. In some embodiments, the angular separation between radially consecutive channels of the first and second channels is between about 3° and 35°.

In some embodiments, the outer susceptor further comprises a support region positioned between the first channel region and the aperture, wherein the support region comprises an outer support region and an inner support region, wherein the outer support region has an elevated portion relative to the inner support region, wherein the outer support region is configured to support the inner susceptor. In some embodiments, the first channel region comprises an outer channel region and an inner channel region, wherein the outer channel region has an elevated portion relative to the inner channel region, the outer channel region configured to support the substrate.

In some embodiments, the support region comprises a third plurality of channels fluidly connected to the first plurality of channels. In some embodiments, the one or more support elements comprises at least three radial protrusions extending into the aperture. In some embodiments, the inner susceptor comprises one or more recesses, each recess configured to engage with a corresponding radial protrusion in the assembled state and prevent movement of the inner susceptor relative to the outer susceptor. In some embodiments, at least one of the first or second pluralities of channels comprises between 20 and 30 channels. In some embodiments, at least one of the first or second pluralities of channels comprises between 30 and 60 channels.

In some embodiments, a susceptor includes: a face configured to support a substrate thereon; an outer edge forming an outer perimeter around the face; a back surface opposite the face, wherein the face comprises: a channel region positioned between an the outer edge and a center of the face; and a plurality of channels disposed within the channel region and extending radially relative to the center of the face; and a radially extending substantially flat and smooth rim region between the outer edge and an outer radial boundary of the channel region.

BRIEF DESCRIPTION OF THE DRAWINGS

FIG. 19 shows a cross sectional side view of a portion of a susceptor.

FIG. 20 shows the cross sectional side view of FIG. 19 with an indication of fluid flow within the susceptor in the assembled state.

DETAILED DESCRIPTION

Figure 1:
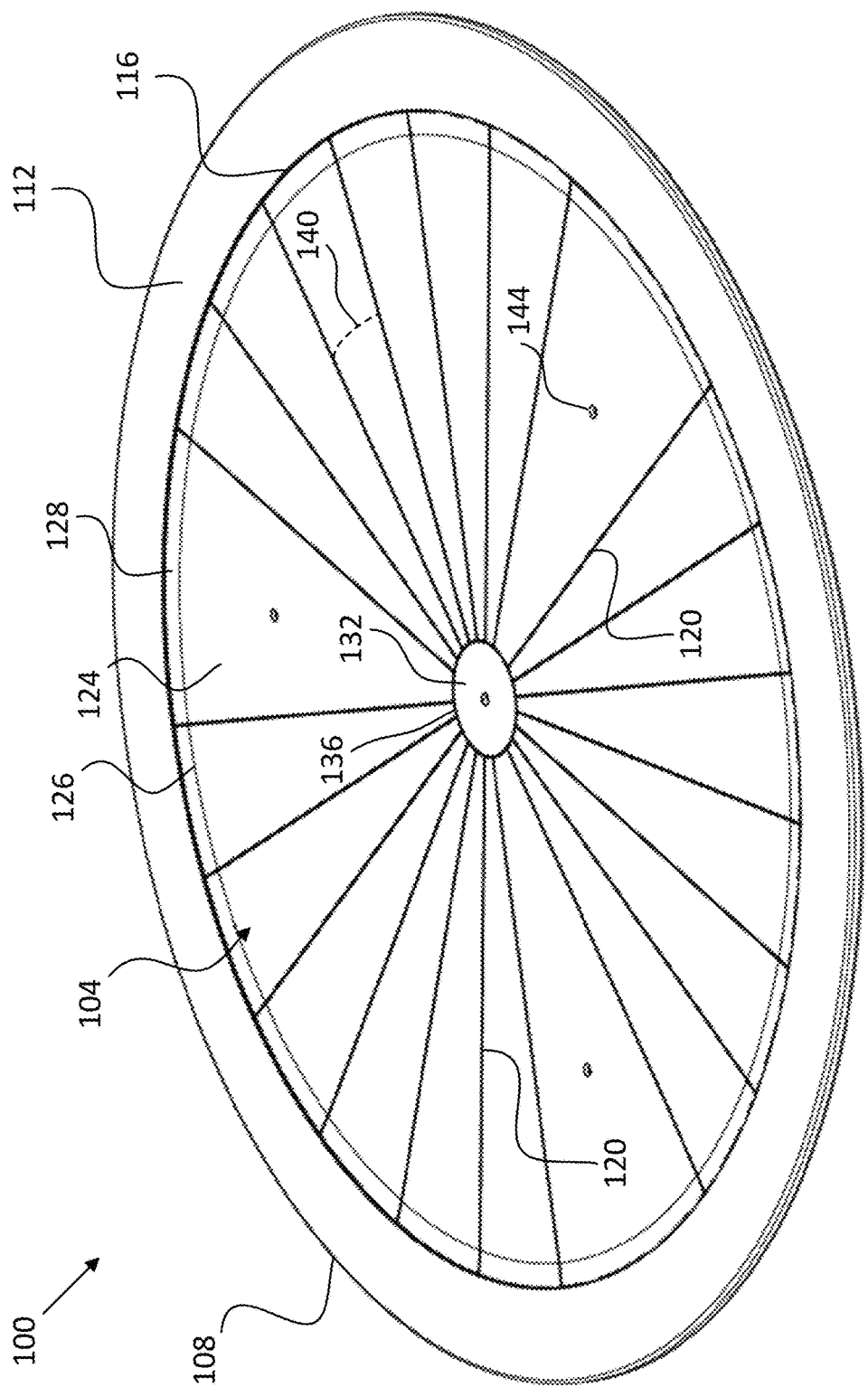
FIG. 1 shows an example susceptor that may be used to support a substrate (e.g., wafer).

Susceptors are commonly formed by machining graphite into a desired shape and applying a silicon carbide (SiC) coating. Susceptors can be formed in different shapes, but many are circular.

As noted above, a number of quality control issues can arise during processing, relating to the physical interaction between the substrate and the susceptor. These issues can include, for example, substrate sliding, sticking, and curling, and backside deposition. Such quality control issues can decrease the overall quality of the substrates and semiconductor devices, resulting in reduced yield and increased costs.

Backside deposition occurs when process gases flow into the space between the substrate and the susceptor and deposit on a back surface of the substrate. Because the flow of the process gases is not controlled between the substrate and the susceptor, random deposition can occur on the backside of the substrate. This random deposition can create thickness inconsistencies on the backside, which can affect local site flatness on the front side, and ultimately cause device uniformity issues.

In a typical process, a reactant gas is passed over the heated wafer, causing the chemical vapor deposition (CVD) of a thin layer of reactant material on the wafer. Through sequential processing, multiple layers are made into integrated circuits. Other exemplary processes include sputter deposition, photolithography, dry etching, plasma processing, and high temperature annealing. Many of these processes require high temperatures and can be performed in the same or similar reaction chambers.

Wafers may be processed at various temperatures to promote high quality deposition. Temperature control is especially helpful at temperatures below the mass transport regime, such as about 500° C. to 900° C. for silicon CVD using silane. In this kinetic regime, if the temperature is not uniform across the surface of the wafer, the deposited film thickness will be uneven. However, lower temperatures may sometimes be used in certain scenarios.

The diameter of the wafer can influence the processing as well. In recent years, single-wafer processing of large diameter wafers has become more widely used for a variety of reasons, including the desire for greater precision in process control than may be achieved with batch-processing. Wafers may be made of silicon, most commonly with a diameter of about 150 mm (about 6 inches) or of about 200 mm (about 8 inches) and with a thickness of about 0.725 mm. Recently, larger silicon wafers with a diameter of about 300 mm (about 12 inches) and a thickness of about 0.775 mm have been utilized because they exploit the benefits of single-wafer processing even more efficiently. Even larger wafers are expected in the future. A typical single-wafer susceptor includes a pocket or recess within which the wafer rests during processing. In many cases, the recess is shaped to receive the wafer very closely.

There are a variety of quality control problems associated with handling of substrates. These problems include substrate slide, stick, and curl. These problems primarily occur during placement and subsequent removal of substrates in high temperature process chambers, particularly single-wafer chambers.

A substrate may be moved within the reaction chamber by an effector or other robotic substrate handling device, such as a Bernoulli wand. A Bernoulli wand is described in U.S. Pat. No. 5,997,588, the entire disclosure of which is hereby incorporated by reference herein for all purposes.

Substrate "slide" or "skate" occurs during substrate unload when a cushion of gas in the susceptor on the upper surface of the susceptor, for example, in the susceptor's recess or pocket is unable to escape fast enough to allow the substrate to quickly and precisely transfer onto the susceptor from the effector. The substrate floats momentarily above the susceptor as the gas slowly escapes, and it tends to drift off-center. Thus, the substrate may not rest in the center of the pocket as normally intended, and uneven heating of the substrate can result. Such drifting of the substrate to the edge of a susceptor can result in poor thickness uniformity, poor resistivity uniformity, and crystallographic slip, depending on the nature of the layer being deposited.

In some embodiments, a plurality of protrusions (e.g., pins, prongs, etc.) may lift the substrate from the susceptor, to facilitate transfer to or from the susceptor by an effector.

During substrate unload, "stick" can occur when the substrate clings to the underlying support because gas is slow to flow into the small space between the substrate and the surface of the substrate support pocket. This creates a vacuum effect between the substrate and the substrate support as the substrate is lifted. Stick can contribute to particle contamination due to scratching against the substrate support and, in extreme cases, can cause lifting of the substrate holder on the order of 1 to 2 mm.

Substrate "curl" is warping of the substrate caused by radial and axial temperature gradients in the substrate. Severe curl can cause a portion of the substrate to contact the bottom side of a Bernoulli wand, for example, when a cold substrate is initially dropped onto a hot substrate support. Curl can similarly affect interaction with other robotic substrate handling devices. In the case of a Bernoulli wand, the top side of the substrate can scratch the Bernoulli wand, causing particulate contamination on the substrate. This significantly reduces yield.

A susceptor can include flow channels or perforated designs to reduce slide, stick, curl, backside deposition, and other substrate processing quality issues. For example, an upper surface of a susceptor can include channels that allow generally horizontal flow along the upper surface to reduce these issues. However, susceptors that include radially channeled grid designs can still cause backside damage on the substrate. A perforated susceptor can include additional vent channels that allow flow through an upper surface of the susceptor (e.g., vertically) to prevent such damage. Nonetheless, in some susceptors, backside deposition may still occur on perforated substrates that include such vents. Additionally, vent holes may have disadvantageous locations or be incompatible with grids or other channeled structures that allow gases to access the backside of the susceptor. Embodiments of horizontal channels that provide improved venting, and/or with reduced substrate stick may be a solution to these problems, as described in more detail below. Some embodiments may also provide aesthetically pleasing benefits.

Reference will now be made to the Figures. FIG. 1 shows an example susceptor 100 that may be used to support a substrate (e.g., wafer). The susceptor 100 can include an outer edge 108 forming an outer perimeter around a face 104. The face 104 can include a rim region 112, a channel region having an inner channel region 124 and an outer channel region 128, and an inner region 132. The face 104 may further include one or more channels 120. The susceptor 100 may comprise one or more materials, such as elemental or molecular materials. Such materials can include non-oxide ceramics, such as silicon carbide (SiC or CSi), graphite, or any other ceramic. Other materials may be used, such as metal. In some embodiments, the susceptor 100 may include a silicon carbide coating, such as silicon-carbide-coated graphite.

The face 104 may be substantially flat, although it may include other profiled portions as described below. Additionally or alternatively, the susceptor 100 may have a relatively low profile (i.e., general cross-sectional thickness) to reduce weight of the susceptor 100 and/or to allow for more precise handling of the substrate. The face 104 may be configured to hold or support the substrate (not shown). The edge 108 may be substantially round, to form an approximately circular susceptor.

The rim region 112 can be positioned radially outwardly from the channel region, and may provide additional structural integrity and/or easier access to portions of the susceptor 100 as needed. The rim region 112 may be bounded between the edge 108 and an outer radial boundary 116 of the outer channel region 128. Any "boundary" described herein may be a subtle difference in rise angle, material, curvature/concavity, smoothness, and/or other difference between adjacent regions. The rim region 112 may be substantially flat and/or smooth. For example, the rim region 112 may be substantially free of channels, protrusions, holes, and/or other irregularities in the surface of the rim region 112. The rim region 112 can have a radial width (defined as the radial distance between the edge 108 and the outer radial boundary 116) of between about 15 mm and 35 mm, and in some embodiments, about 25 mm.

The channel region can be positioned between the outer radial boundary 116 and an inner radial boundary 136 that forms an outer perimeter around inner region 132. One or both of the outer radial boundary 116 and/or the inner radial boundary 136 may be round, such as substantially a circle or other rounded shape (e.g., oval). The inner region 132 may be substantially flat and/or smooth. For example, the inner region 132 may be substantially free of channels, protrusions, and/or other irregularities. The inner region 132 can shaped and/or sized to provide additional structural integrity to the susceptor 100. For example, an inclusion of irregularities within the inner region 132 may reduce the strength of the inner region 132. In some embodiments, the inner region 132 is recessed relative to the surrounding channel region. The inner radial boundary 136 may be substantially formed by the difference in elevation between the inner region 132 and the inner channel region 124.

The channel region may be disposed adjacent and/or radially inward of the rim region 112. The channel region may be disposed between the rim region 112 and the inner region 132. Within the channel region, one or more channels 120 may be formed within the face 104, but for convenience, reference will be made to a plurality of channels 120 throughout. The channels 120 may extend radially outwardly from a center of the face 104 towards (and in some embodiments, to and through) the edge 108. In some embodiments, the channels 120 can extend from the inner radial boundary 136 to the outer radial boundary 116. The channels 120 may extend substantially radially from the center of the face 104, and in some embodiments, from the inner radial boundary 136. In some embodiments, consecutive channels 120 may form an angular separation 140, as shown. The angular separation 140 can form an acute angle. For example, the angular separation 140 may be between about 5° and 35° and in some embodiments is about 15° between at least two consecutive channels 120. Consecutive channels 120 may be referred to as successive or adjacent channels 120 herein. A plurality of regularly spaced consecutive channels 120 may have a substantially the same angular separation 140 between each set of consecutive channels 120. As shown, the face 104 may include multiple sets of such pluralities of consecutive channels 120. The regularity of angular separation 140 may be interrupted, for example, by one or more irregularities in the channel region. For example, as shown, one or more apertures 144 may be included in the channel region. The apertures 144 may be configured to allow raisers (e.g., pins, prongs, rods, etc.) therethrough. The raisers may be used by a susceptor support apparatus (e.g., a spider) (not shown) to raise a wafer up from the susceptor 100 without raising the susceptor 100 itself. Accordingly, an angular separation 140 between consecutive channels 120 where irregularities may be found can be greater, such as double the angular separation 140 described above. Such increased angular separation can provide additional structural integrity to those portions of the susceptor which include apertures 144, and/or can provide additional space to avoid interference with the raisers and susceptor support apparatus.

The channel region can include the inner channel region 124 and the outer channel region 128. The outer channel region 128 can form the outer boundary of the substrate "pocket." The inner channel region 124 may transition to the outer channel region 128 at a channel region boundary 126. For example, the outer channel region 128 may be configured to support the substrate. For example, the outer channel region 128 may have a sloped and/or concave surface, which forms an elevated portion, relative to the inner channel region 124, to limit the amount of the substrate (e.g., an edge or rim) that is touching the susceptor 100. The majority of surface area of the channel region may be dedicated to the inner channel region 124. The inner channel region 124 may be substantially flat and/or smooth. In some embodiments, the inner channel region 124 is substantially parallel to one or more of the inner region 132, the rim region 112, and/or a back surface 106 (shown in FIG. 2 below). One or more portions of the channel region disposed between consecutive channels 120 may increase in area moving from the inner radial boundary 136 to the outer radial boundary 116. One or more of the channels 120 may be substantially straight. The number of channels 120 within the channel region can be between about 5 and 50, or between about 18 and 30, but other variants are also possible. In some embodiments, the number of channels is 24.

Figure 2:
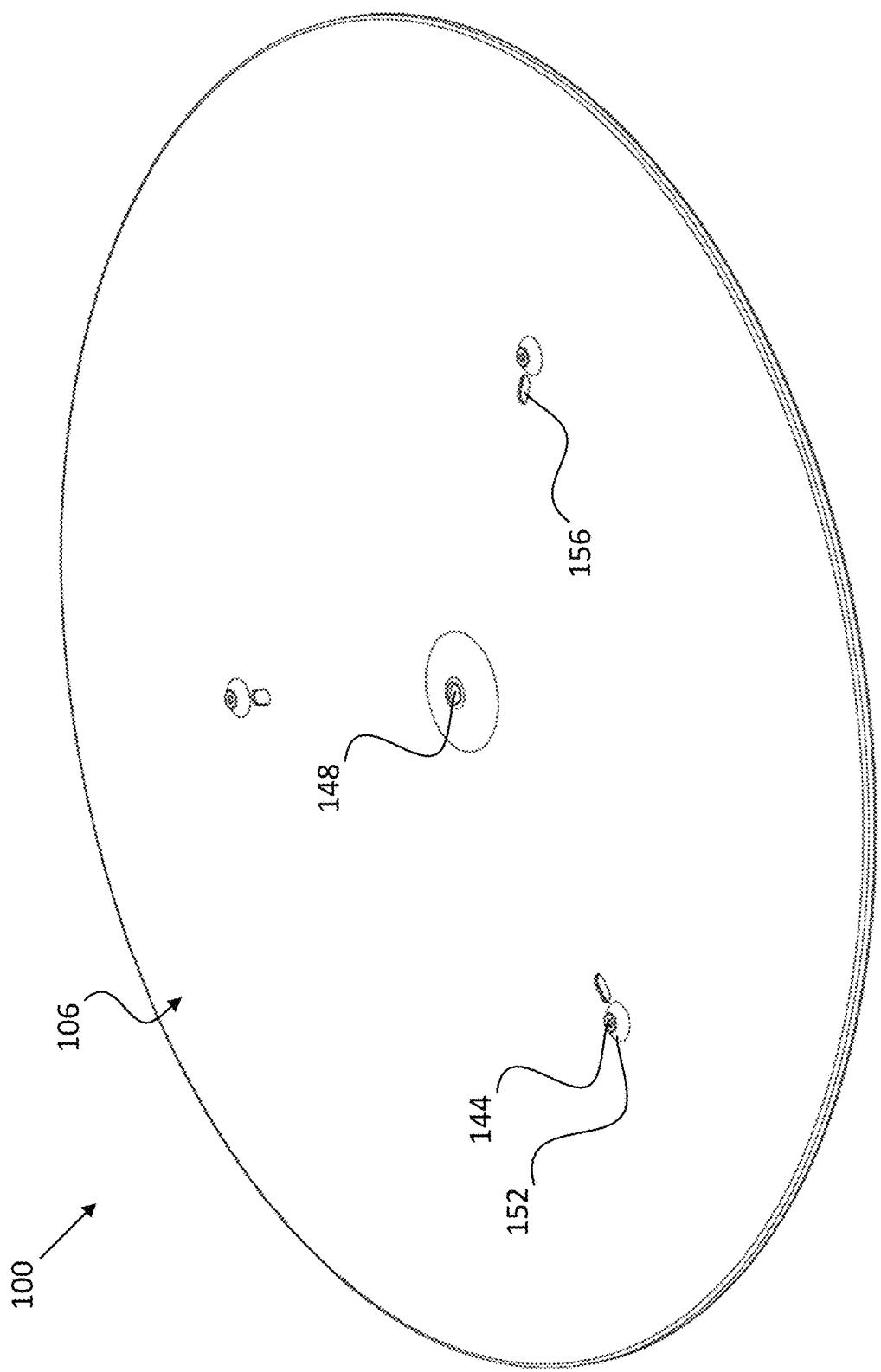
FIG. 2 shows a back surface of the example susceptor of FIG. 1.

FIG. 2 shows a back surface 106 of the example susceptor 100 of FIG. 1. The back surface 106 may be substantially flat and/or smooth. As shown, one or more apertures 144 may be included as noted above. The apertures 144 may extend between the face 104 and the back surface 106 so as to allow raisers (described above) therethrough. The apertures 144 may be disposed at least partially within corresponding protrusions 152 extending from surface 106. The protrusions 152 may provide additional structural strength to the susceptor 100 where the raisers will pass through the susceptor 100.

A centering cavity 148 may be included in the back surface 106 to help center the susceptor 100 on a susceptor support apparatus. For example, the centering cavity 148 may be configured to receive a pin therein to align and/or prevent the susceptor 100 and/or the substrate from translating relative to the support apparatus. This can promote accuracy of the substrate placement and/or the precision of the deposition on the substrate. The centering cavity 148 may be surrounded by a structural protrusion for added structural strength. Additional stabilizing elements 156 (e.g., recesses (such as slotted recesses), protrusions, etc.) may be included to align and/or prevent movement (e.g., rotation) of the susceptor 100 during substrate handling or processing.

Figure 3:
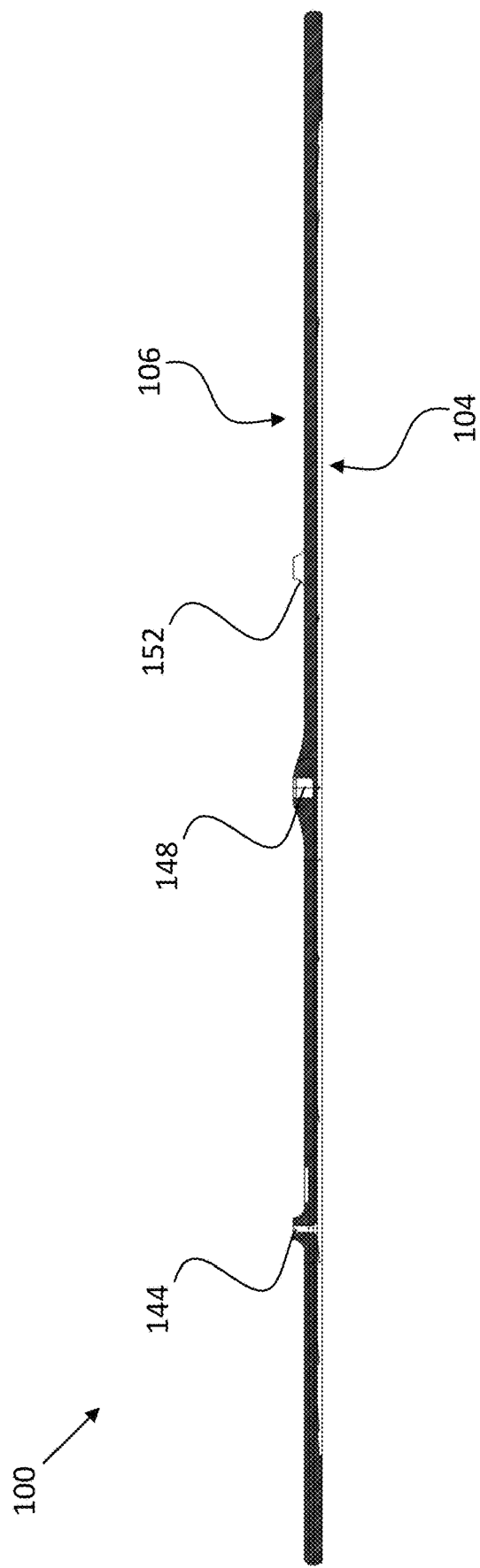
FIG. 3 shows a cross-sectional side view of the example susceptor shown in FIGS. 1-2.

FIG. 3 shows a cross-sectional side view of the example susceptor 100 shown in FIGS. 1-2. The cross section passes through a center of the susceptor 100. As shown, the centering cavity 148 is disposed at a center of the back surface 106. The centering cavity 148 may be opposite the inner region 132 of the face 104. The apertures 144 may be disposed within the channel region (e.g., the inner channel region 124). As shown, the back surface 106 may be substantially parallel to the face 104.

Figure 4:
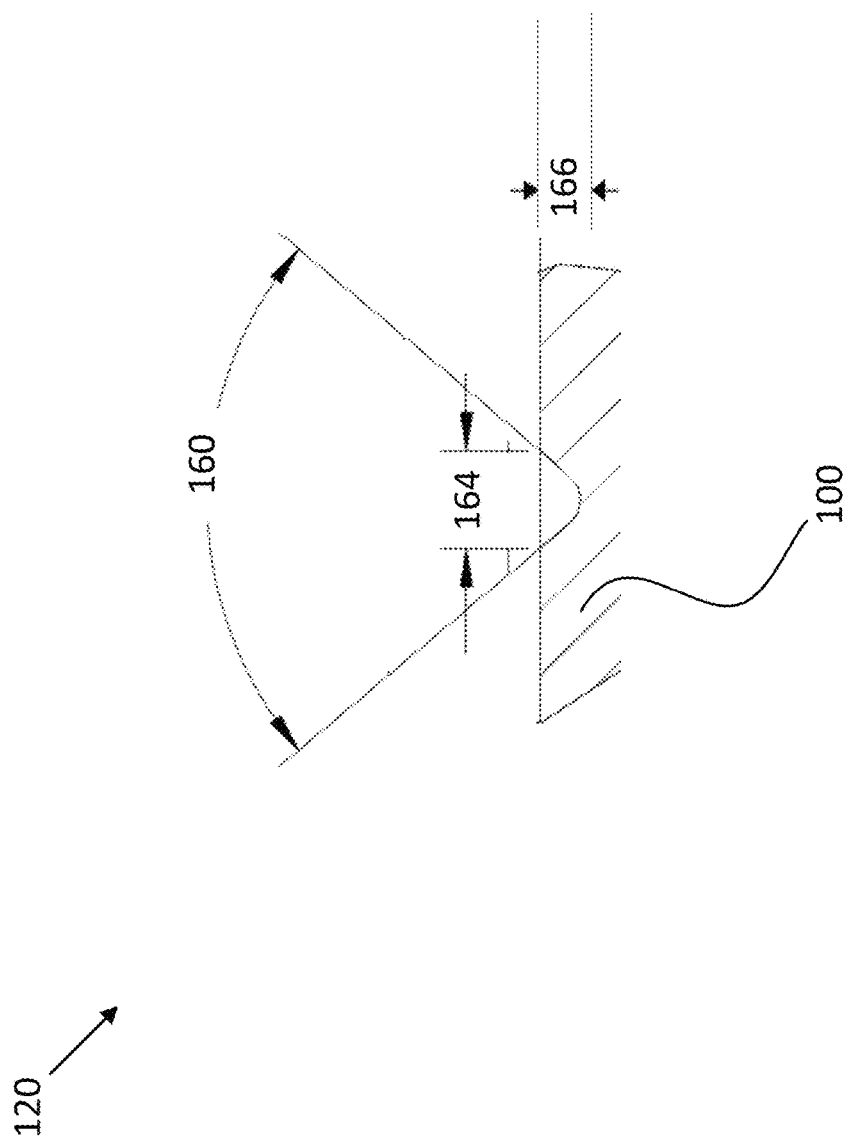
FIG. 4 shows a cross sectional view of an example channel.

FIG. 4 shows a cross sectional view of an example channel 120. Other shapes of the cross section are possible (such as those described with reference to the channels 220 below). As shown, the channel 120 can include substantially flat sidewalls. The sidewalls may form an angle 160 such as an acute angle. The angle 160 may be between 30° and 120° and may be approximately 80°. The width 164 of the channel 120 may be between about 0.1 mm and 2.5 mm and in some embodiments is about 0.6 mm. The depth 166 of the channel 120 may be between about 0.05 mm and 1.5 mm and in some embodiments is about 0.25 mm. The vertex between the sidewalls can be curved.

Figure 5:
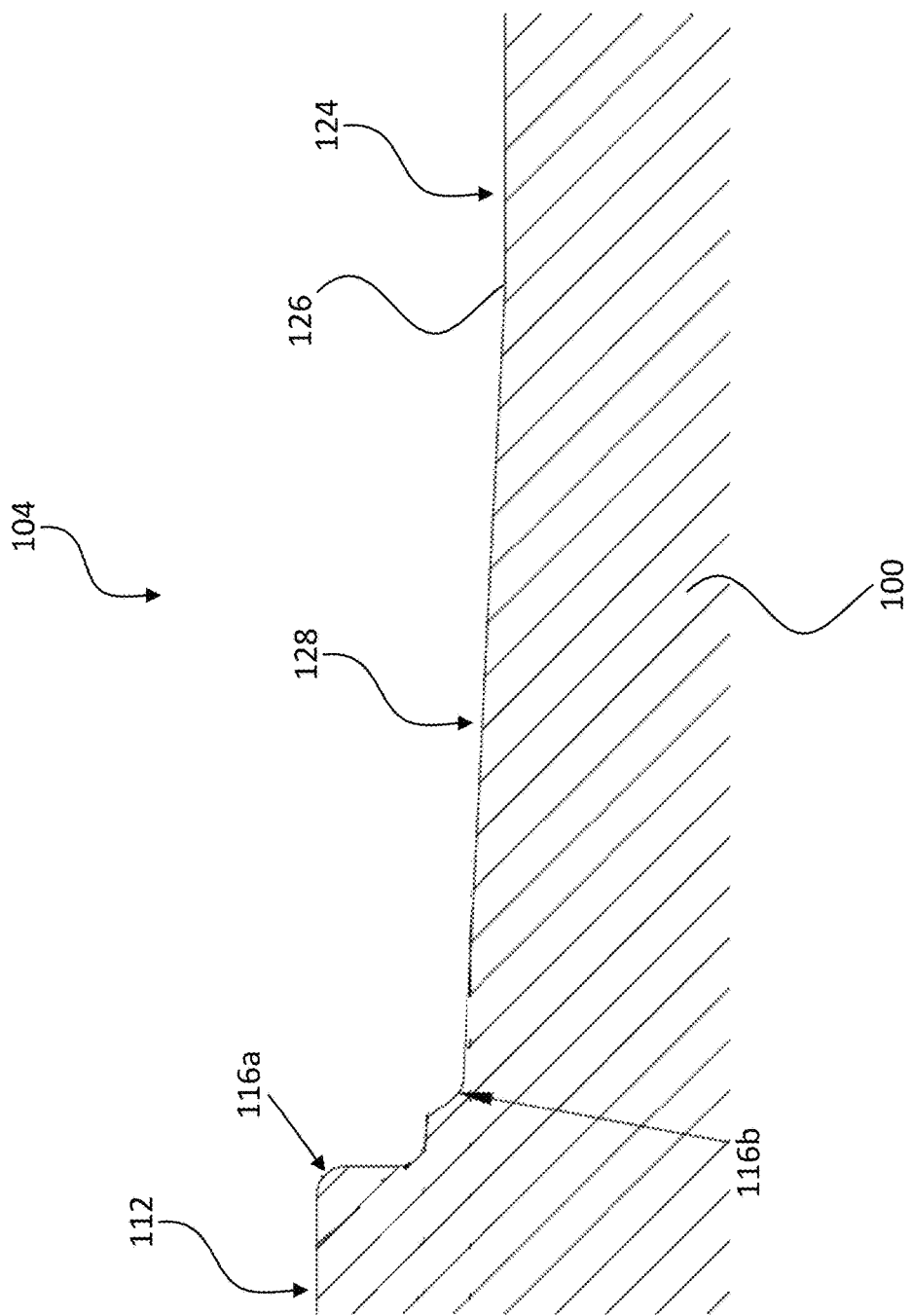
FIG. 5 shows a detail view of a cross section of a portion of a susceptor.

FIG. 5 shows a detail view of a cross section of a portion of a susceptor, showing a side elevational profile of an example face 104. As shown, the outer channel region 128 may be tapered, such that it is disposed at a slight incline relative to the inner channel region 124. For example, a rise angle of the outer channel region 128 relative to the inner channel region 124, which transitions at the channel region boundary 126, may be between about 0.5° and 5° and in some embodiments is about 3°. The rise angle can be an absolute value (for example, when the inner channel region 124 is substantially flat). In some embodiments, the outer channel region 128 can be concave. A tapered or concave region 128 can provide a higher elevation, relative to the inner channel region 124, to reduce wafer contact with the susceptor. The outer radial boundary 116 may include a first outer radial boundary 116a and a second outer radial boundary 116b in some embodiments.

The portion between the first outer radial boundary 116a and the second outer radial boundary 116b may include different profiles which can affect gas distribution, for example, in cross-flow reactor environments. For example, the profile of this area can be a non-smooth profile, as shown. The profile shape of the susceptor between the first outer radial boundary 116a and the second outer radial boundary 116b may be selected to help improve the shadowing effect. For example, the profile shape can allow reactant to reach closer to the edge of the wafer, resulting in increased yield, for example, with wafers of a certain diameter (e.g., about 300 mm).

The susceptor 100 may be surface-treated to improve performance. For example, one or more regions of the face 104 may be polished to reduce the likelihood of deformities (e.g., caused by substrate sticking) to affect the substrate. As an example, the outer channel region 128 may be polished to reduce sticking of the edge of the substrate thereto. Portions of the susceptor 100 may be coated to improve performance. For example, the face 104 may be coated with silicon carbide.

The susceptor 100 can have a variety of dimensions. The susceptor 100 can have a thickness of between about 1 mm and 15 mm and in some embodiments is about 3.8 mm. A diameter of the edge 108 and/or the outer radial boundary 116 may be between about 100 mm and 500 mm and in some embodiments is about 300 mm. Each aperture 144 can have a diameter of between about 0.5 mm and 6 mm and in some embodiments is about 1.6 mm.

Certain embodiments may include a susceptor that includes a plurality of components. For example, a susceptor may include an inner susceptor and an outer susceptor which in some embodiments, are configured to allow relative movement therebetween. Such susceptors may operate, for example, at a higher temperature (e.g., up to about 1200° C.) than the susceptors described in FIGS. 1-5. The inner susceptor and outer susceptor can include many similar features that function similarly as similar features described with respect to other susceptors described herein which may not have an inner and outer susceptor.

Figure 6:
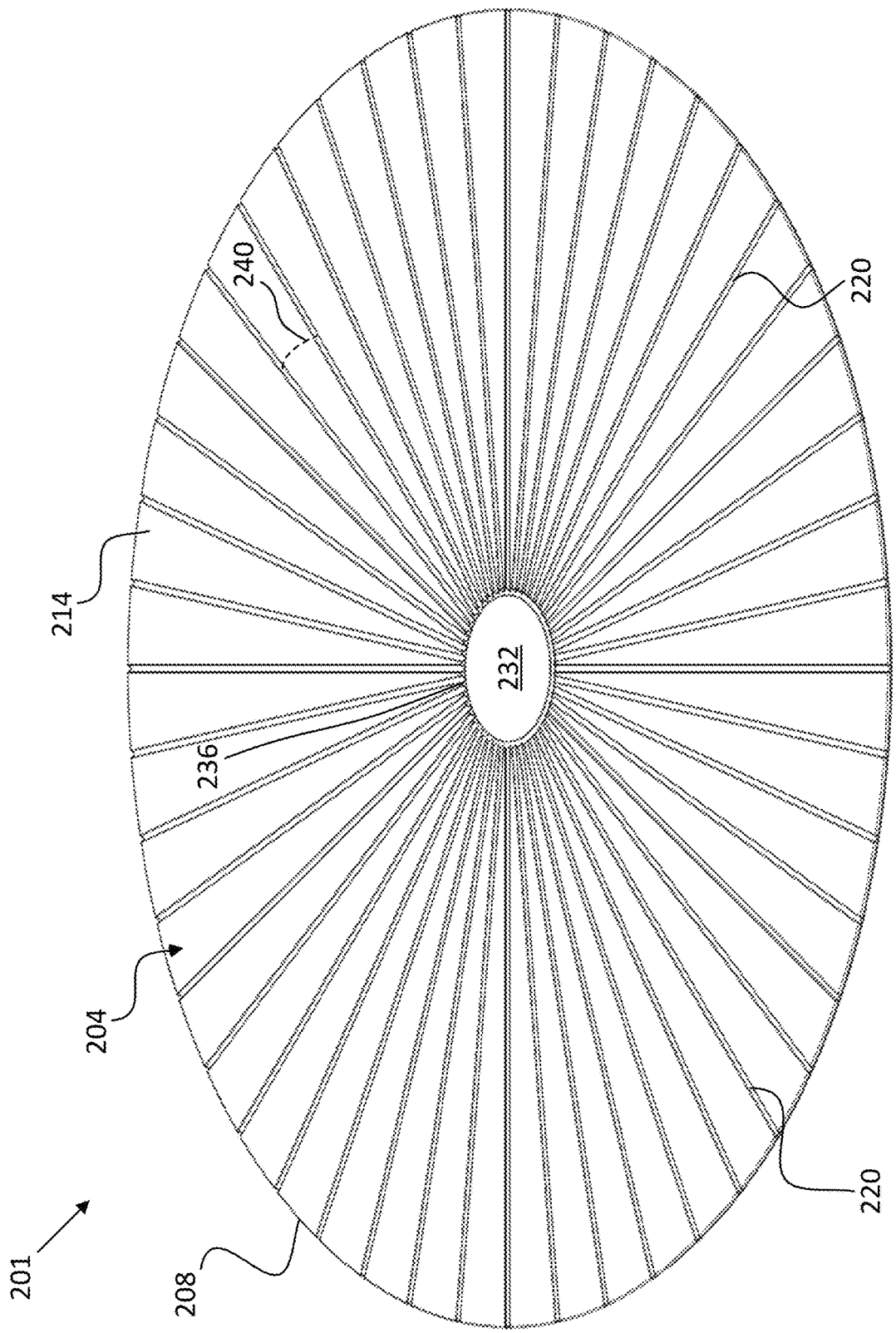
FIG. 6 shows an example inner susceptor that may be used with a corresponding outer susceptor to support a substrate.

FIG. 6 shows an example inner susceptor 201 that may be used with a corresponding outer susceptor 202 (described below) to support a substrate. The inner susceptor 201 can include an edge 208 and a face 204. The face 204 can include a channel region 214 and an inner region 232. The face 204 may further include one or more channels 220.

The face 204 may be substantially flat, although it may include other profiled portions as described below. Additionally or alternatively, the inner susceptor 201 may have a relatively low profile (i.e., general cross-sectional thickness) to reduce weight of the inner susceptor 201 and/or to allow for more precise handling of the substrate and/or inner susceptor 201. The face 204 of the inner susceptor 201 may be configured to hold or support the substrate (not shown), for example, during substrate transfer processes. During other times, an outer susceptor 202 (described below) may be configured to support the substrate. The edge 208 may be substantially round, to form an approximately circular susceptor. Aside from any channels 220, the face 204 may be substantially flat and/or smooth.

As noted above, channel region 214 can be positioned between the edge 208 and an inner radial boundary 236 that forms an outer perimeter around the inner region 232. The inner radial boundary 236 may be round, such as substantially a circle or other rounded shape (e.g., oval). The inner region 232 may be substantially flat and/or smooth. For example, the inner region 232 may be substantially free of channels, protrusions, and/or other irregularities. The inner region 232 can shaped and/or sized to provide additional structural integrity to a central portion of the inner susceptor 201. For example, an inclusion of irregularities within the inner region 232 may otherwise reduce the strength of the structure of the inner susceptor 201 at or near the inner region 232. In some embodiments, the inner region 232 is recessed relative to the surrounding channel region 214. The inner radial boundary 236 may be substantially formed by the difference in elevation between the inner region 223 and the inner channel region 224.

Within the channel region 214 of the inner susceptor 201, one or more channels 220 may be formed within the face 204, but for convenience, reference will be made to a plurality of channels 220 throughout. The channels 220 may extend radially outwardly from a center of the face 204 towards (and in some embodiments, to and through) the edge 208. In some embodiments, the channels 220 can extend from the inner radial boundary 236 to the edge 208. The channels 220 may extend substantially radially from the center of the face 104, and in some embodiments, from the inner radial boundary 236. In some embodiments, consecutive channels 220 may form an angular separation 240, as shown. The angular separation 240 can form an acute angle. For example, the angular separation 240 may be between about 3° and 30° and in some embodiments is about 7.5° between at least two consecutive channels 120. Consecutive channels 220 may be referred to as successive or adjacent channels 220 herein. A plurality of regularly spaced consecutive channels 220 may have a substantially the same angular separation 240 between each set of consecutive channels 220. Though not shown, the face 204 may include multiple sets of such pluralities of consecutive channels 220. The regularity of angular separation 240 may be interrupted, for example, by one or more irregularities in the channel region 214. For example, one or more apertures 144 may be included in the channel region. Accordingly, an angular separation 240 between consecutive channels 220 where irregularities may be found can be greater, such as double the angular separation 240 described above. Such increased angular separation can provide additional structural integrity and/or can provide additional space to avoid interference with the raisers and susceptor support apparatus. The number of channels 220 within the channel region 214 can be between about 5 and 60, but other variants are also possible. In some embodiments, the number of channels is about 48 (as shown) or about 24 (see FIG. 8 below).

Figure 7:
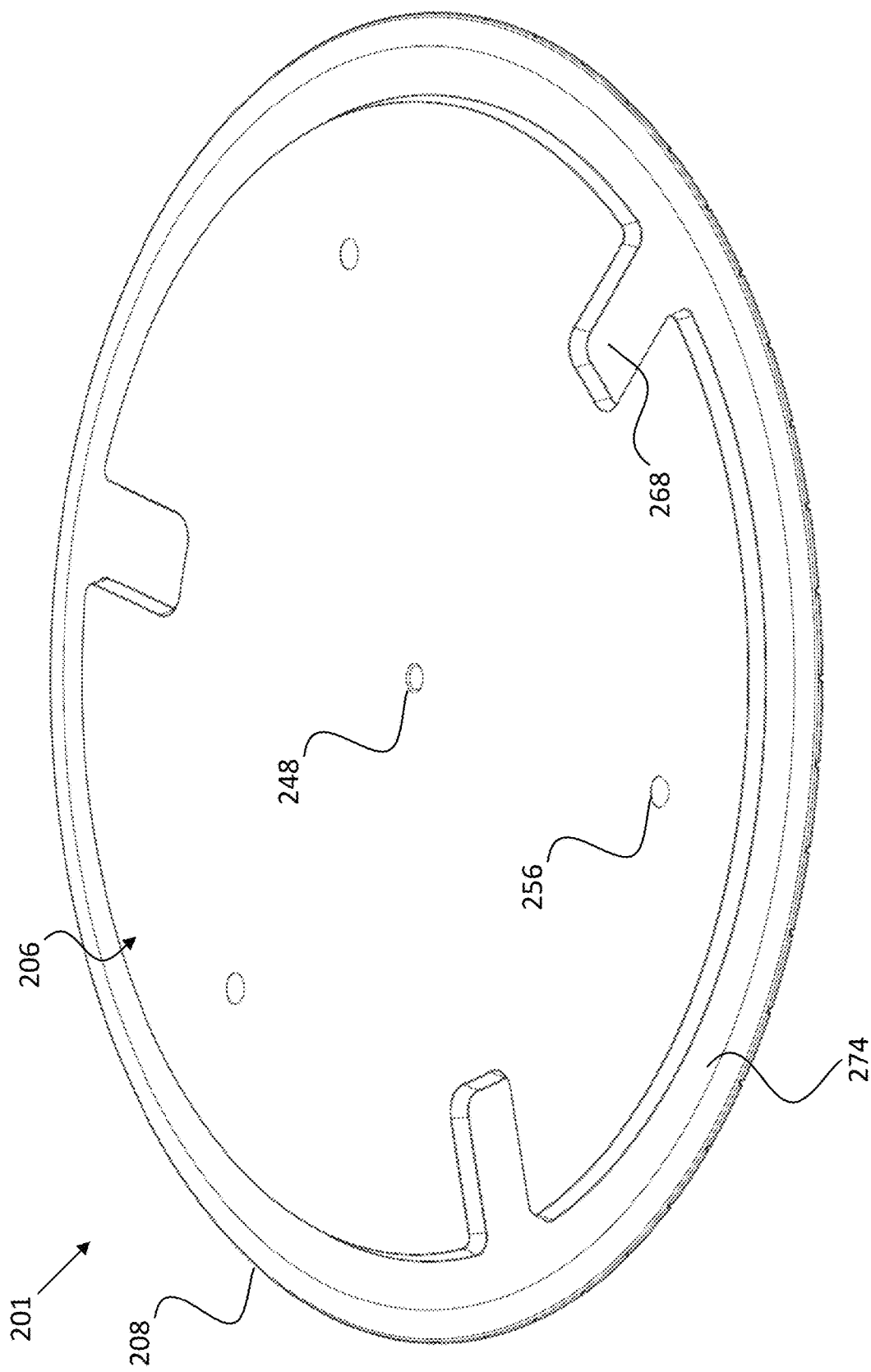
FIG. 7 shows a back view of the example inner susceptor of FIG. 6.

FIG. 7 is a back view showing a back surface 206 of the example inner susceptor 201 of FIG. 6. The back surface 206 may be substantially flat and/or smooth. Additionally or alternatively, the inner susceptor 201 can include a tapered portion 274. The tapered portion 274 may be disposed primarily near the edge 208 of the inner susceptor 201. As shown, one or more stabilizing elements 256 may be included. The stabilizing elements 256 (e.g., recesses, protrusions, etc.) may be included to prevent rotation of the inner susceptor 201 during deposition, relative to the outer susceptor. Additionally or alternatively, the one or more stabilizing elements 256 may be used to allow a spider or other support mechanism to raise the inner susceptor 201 relative to the outer susceptor 202.

A centering cavity 248 may be included in the back surface 206 to help center the inner susceptor 201 on a susceptor support apparatus. For example, the centering cavity 148 may be configured to receive a pin therein to prevent the inner susceptor 201 and/or the substrate from translating relative to the support apparatus. This can promote accuracy of the substrate placement and/or the precision of the deposition on the substrate. Though not shown, the centering cavity 248 may be surrounded by a structural protrusion for added structural strength.

Figure 8:
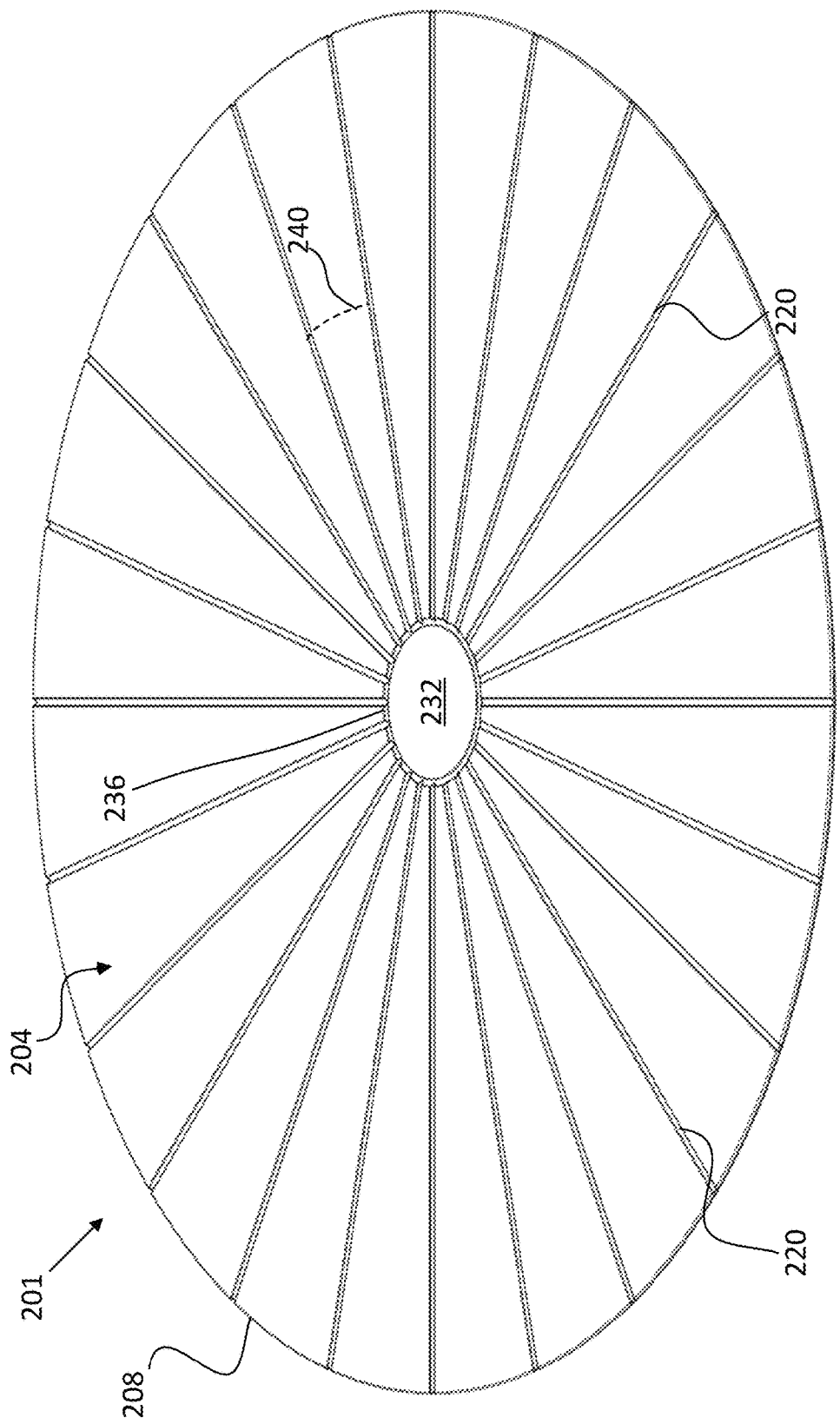
FIG. 8 shows another example inner susceptor with 24 channels.
Figure 9:
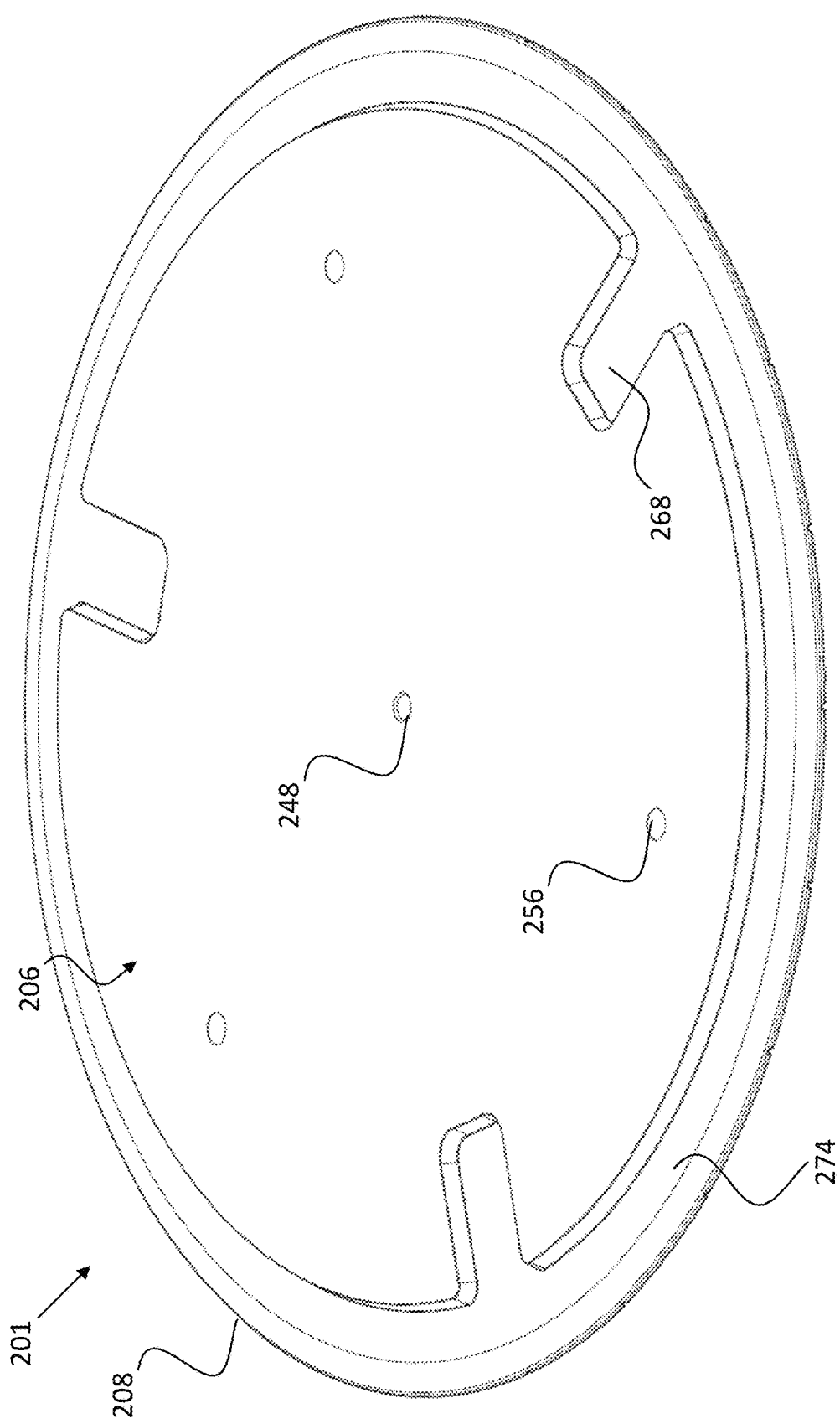
FIG. 9 shows a back view of the example inner susceptor of FIG. 8.

The inner susceptor 201 may further include one or more recesses 268. The recesses 268 may be configured to mate with corresponding elements in the outer susceptor 202 (described in more detail below). The recesses 268 may be radially spaced from one another at approximately even intervals. This can promote greater stability of the inner susceptor 201 during movement of the inner susceptor 201 and/or the outer susceptor 202. The recesses 268 may be substantially rectangular as shown, but other shapes are possible. FIGS. 8-9 show another example inner susceptor 201 having 24 channels instead of 48.

Figure 10:
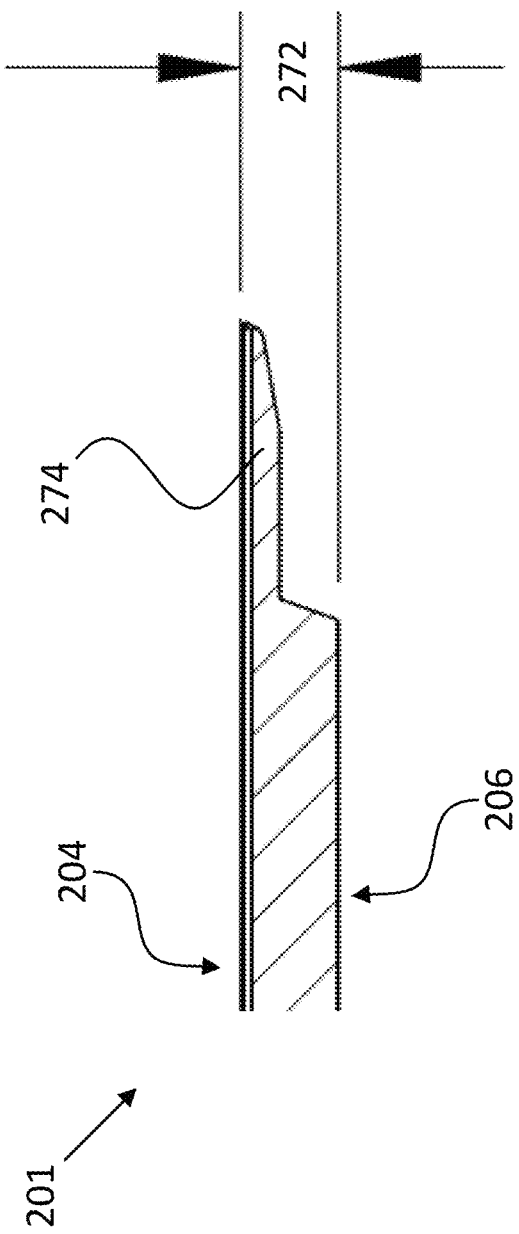
FIG. 10 shows a cross-sectional side view of a portion of any example inner susceptor shown in FIGS. 6-9.

FIG. 10 shows a cross-sectional side view of a portion of any example inner susceptor 201 shown in FIGS. 6-9. As shown, the tapered portion 274 can be disposed along an outer radial portion of the rest of the inner susceptor 201. The inner susceptor 201 can have a thickness 272 of between about 2 mm and 25 mm and in some embodiments is about 5.6 mm.

Figure 11:
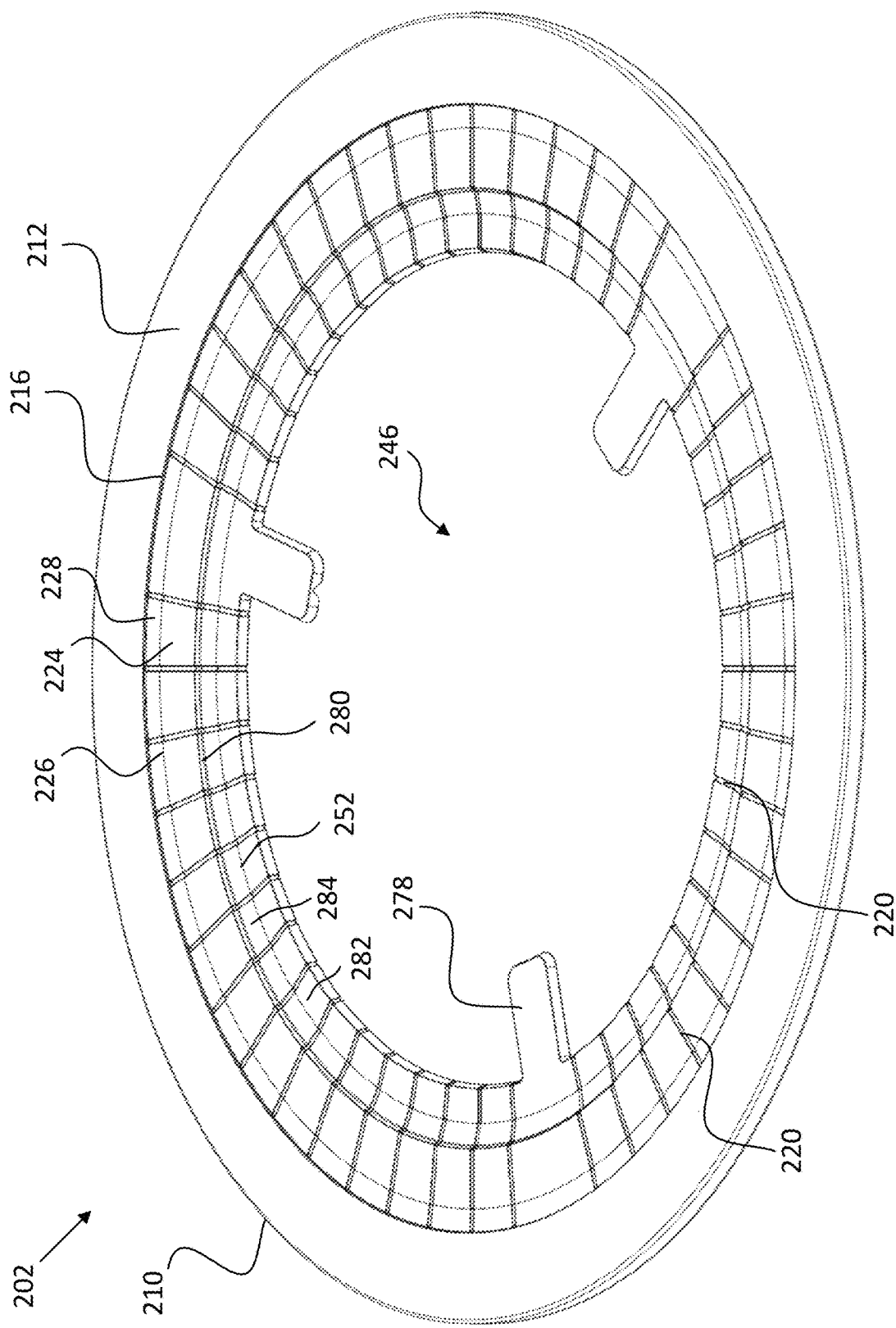
FIG. 11 shows an example outer susceptor that may be used to support a substrate.

FIG. 11 shows an example outer susceptor 202 that may be used to support a substrate (e.g., wafer). The outer susceptor 202 can include an edge 210, a rim region 212, a channel region having an inner channel region 224 and an outer channel region 228, and an aperture 246. The channel region may include one or more channels 220.

The rim region 212 may be substantially flat. Additionally or alternatively, the outer susceptor 202 may have a relatively low profile to reduce weight of the outer susceptor 202 and/or to allow for more precise handling of the substrate. The outer channel region 228 may be configured to hold or support the substrate (not shown). The edge 210 may be substantially rounded. For example, the edge 210 may form substantially a circle or other round shape.

The rim region 212 can be positioned radially outwardly from the channel region, and may provide additional structural integrity and/or easier access to portions of the outer susceptor 202 as needed. The rim region 212 may be bounded between the edge 210 and an outer radial boundary 216 of the outer channel region 228. Any "boundary" described herein may be a subtle difference in rise angle, material, curvature/concavity, smoothness, and/or other difference between adjacent regions. The rim region 212 may be substantially flat and/or smooth. For example, the rim region 212 may be substantially free of channels, protrusions, holes, and/or other irregularities in the surface of the rim region 212.

The outer susceptor 202 can include a channel region disposed between the outer radial boundary 216 and a region boundary 280, and/or a support region disposed between the rim region 212 (e.g., the region boundary 280) and the aperture 246. Thus, the support region may be disposed adjacent and/or radially inward of the channel region. One or more of the outer radial boundary 216, the region boundary 280, and/or the aperture 246 may be round, such as substantially a circle or other rounded shape (e.g., oval). The aperture 246 may be configured to allow access to the inner susceptor 201 by a susceptor support apparatus (not shown), for example during transfer of the substrate.

Within the channel region and/or the support region, one or more channels 220 may be formed, but for convenience, reference will be made to a plurality of channels 220 throughout. The channels 220 may extend from the outer radial boundary 216 to the region boundary 280 and/or to the aperture 246. The channels 220 may extend substantially radially outwardly from the aperture 246 for example, to the region boundary 280, to the outer boundary 216, or to the edge 210. The channels 220 may extend substantially radially outwardly from the region boundary 280, for example, to the 246 for example, to the outer boundary 216, or to the edge 210. In some embodiments, consecutive channels 220 may form an angular separation that corresponds to an angular separation 240 of corresponding consecutive channels 220 of the inner susceptor 201. The angular separation of consecutive channels 220 of the outer susceptor 202 may be between about 5° and 35° and in some embodiments is about 15° between at least two consecutive channels 220. A plurality of consecutive channels 220 may have a substantially the same angular separation 140 between each set of consecutive channels 220. As shown, the outer susceptor 202 may include multiple sets of such pluralities of consecutive channels 220. A regularity of angular separation 140 may be interrupted, for example, by one or more irregularities in the channel region. For example, as shown, one or more support elements 278 may be included in the support region, to provide engagement and support between the inner susceptor 201 and the outer susceptor 202. The support elements 278 may be configured in different ways. For example, the support elements 278 can comprise radial protrusions that extend into aperture 246. The support elements can be configured to engage with (e.g., be received within) corresponding features in the inner susceptor 201, such as recesses 268. Accordingly, an angular separation 240 between consecutive channels 220 where irregularities may be found can be greater, such as double the angular separation 240 described above.

The channel region can include the inner channel region 224 and the outer channel region 228. The outer channel region 228 can form the outer boundary of the substrate "pocket." A channel region boundary 226 may be positioned between the inner channel region 224 and the outer channel region 228. The outer channel region 228 may be configured to support the substrate. For example, the outer channel region 228 may have a sloped and/or concave surface, relative to inner channel region 224, transitioning at the channel region boundary 226, to reduce substrate contact with the outer susceptor 202, similar to the inner channel region 124 and outer channel region 128 and boundary 126 described with reference to FIG. 5 and other embodiments herein. The majority of surface area of the channel region may be dedicated to the inner channel region 224. The inner channel region 224 may be substantially flat and/or smooth. In some embodiments, the inner channel region 224 is substantially parallel to one or more of the rim region 212, the support element(s) 278, and/or a back surface of the outer susceptor 202. One or more portions of the channel region disposed between consecutive channels 220 may increase in area moving from the region boundary 280 to the outer radial boundary 216. One or more of the channels 220 may be substantially straight. The number of channels 220 within the channel region can be between about 5 and 50, but other variants are also possible. In some embodiments, the number of channels is about 48, and in some embodiments (see, e.g., FIGS. 13-14) the number of channels is about 24.

The support region can include the inner support region 282 and the outer support region 284. The outer support region 228 can form an outer boundary to a "pocket" formed by the inner susceptor 201 (FIG. 8), when the inner susceptor 201 is positioned with the outer susceptor 202. The inner support region 282 may be separated from the outer support region 284 by a support region boundary 252. The outer support region 284 may be configured to support the inner susceptor 201 (FIG. 8). For example, the outer support region 284 may have a sloped and/or concave surface so that only a rim or edge of the inner susceptor 201 is touching the outer susceptor 202. The majority of surface area of the support region may be dedicated to the inner support region 282. The inner support region 282 may be substantially flat and/or smooth. In some embodiments, the inner support region 282 is substantially parallel to one or more of the rim region 212, the support element(s) 278, and/or a back surface of the outer susceptor 202. One or more portions of the support region disposed between consecutive channels 220 may increase in area moving from the aperture 246 to the outer radial boundary 216. One or more of the channels 220 may be substantially straight. The number of channels 220 within the support region can be between about 5 and 50, but other variants are also possible. In some embodiments, the number of channels is about 48, and in some embodiments (see, e.g., FIGS. 13-14) the number of channels is about 24. The number of channels in the support region may be the same as the number in the channel region. For example, one or more channels in the support region may link and/or be continuous with corresponding channels in the channel region.

Figure 12:
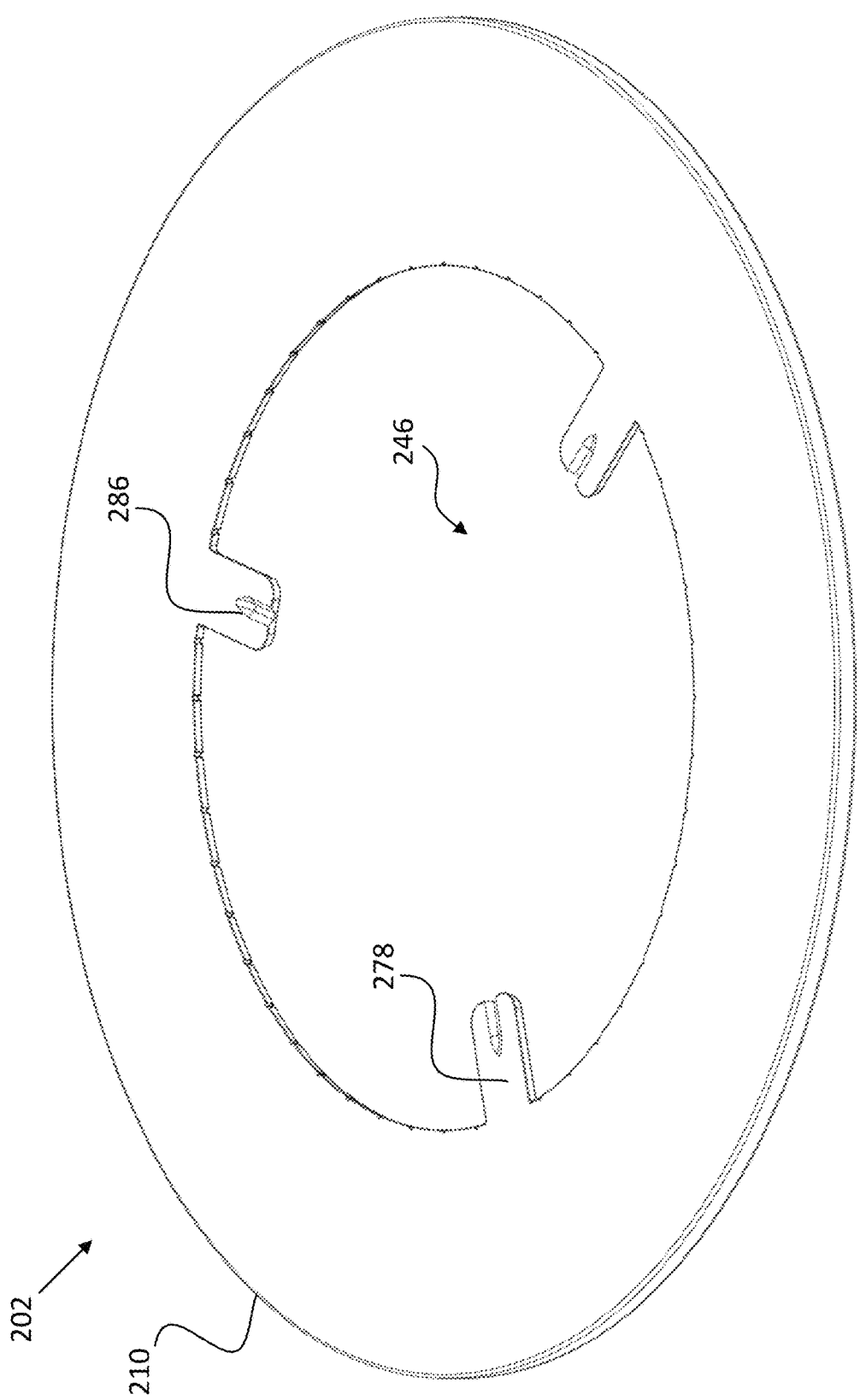
FIG. 12 shows a back view of the example outer susceptor of FIG. 11.
Figure 13:
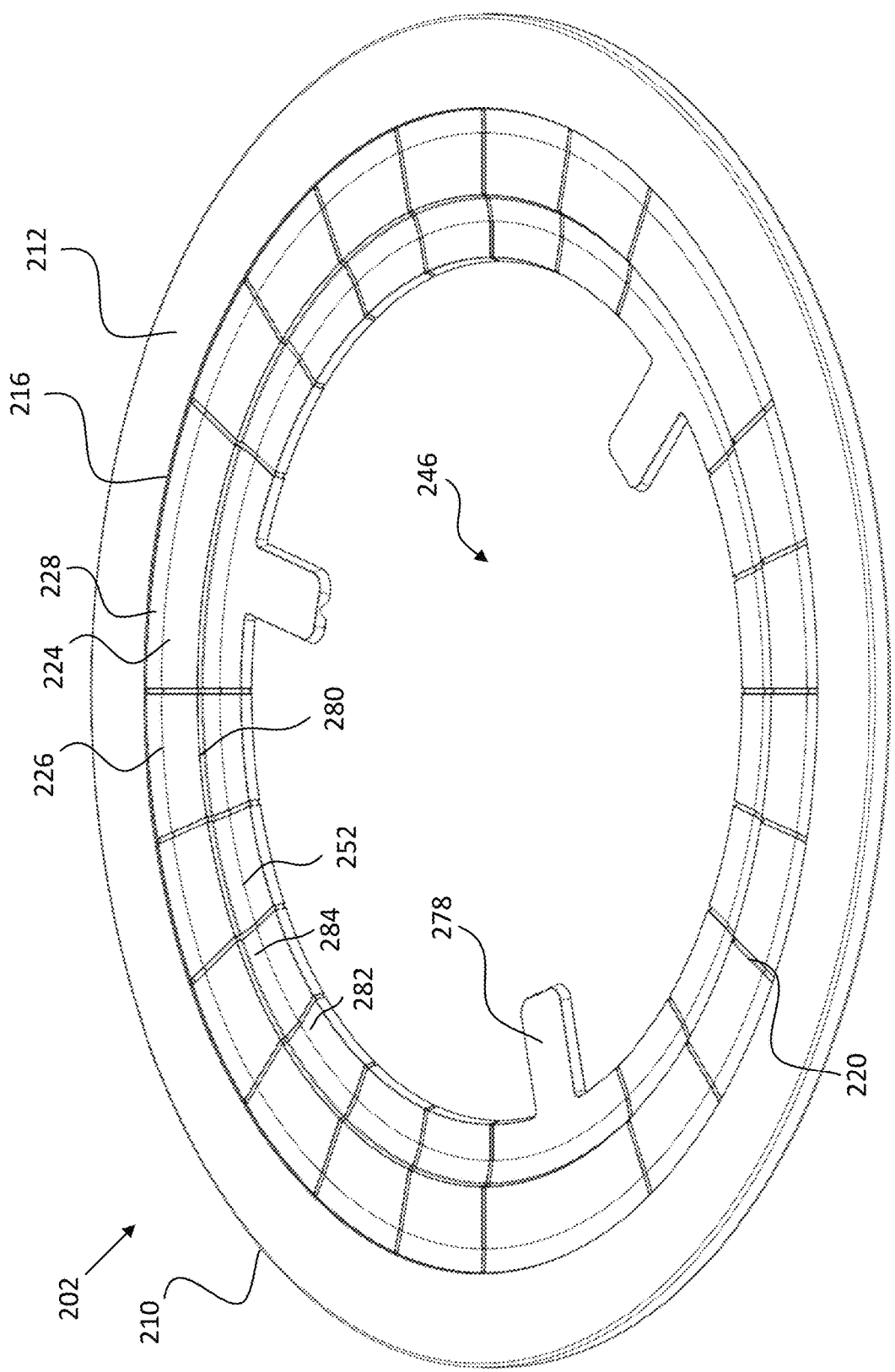
FIG. 13 shows another example outer susceptor with 24 channels.
Figure 14:
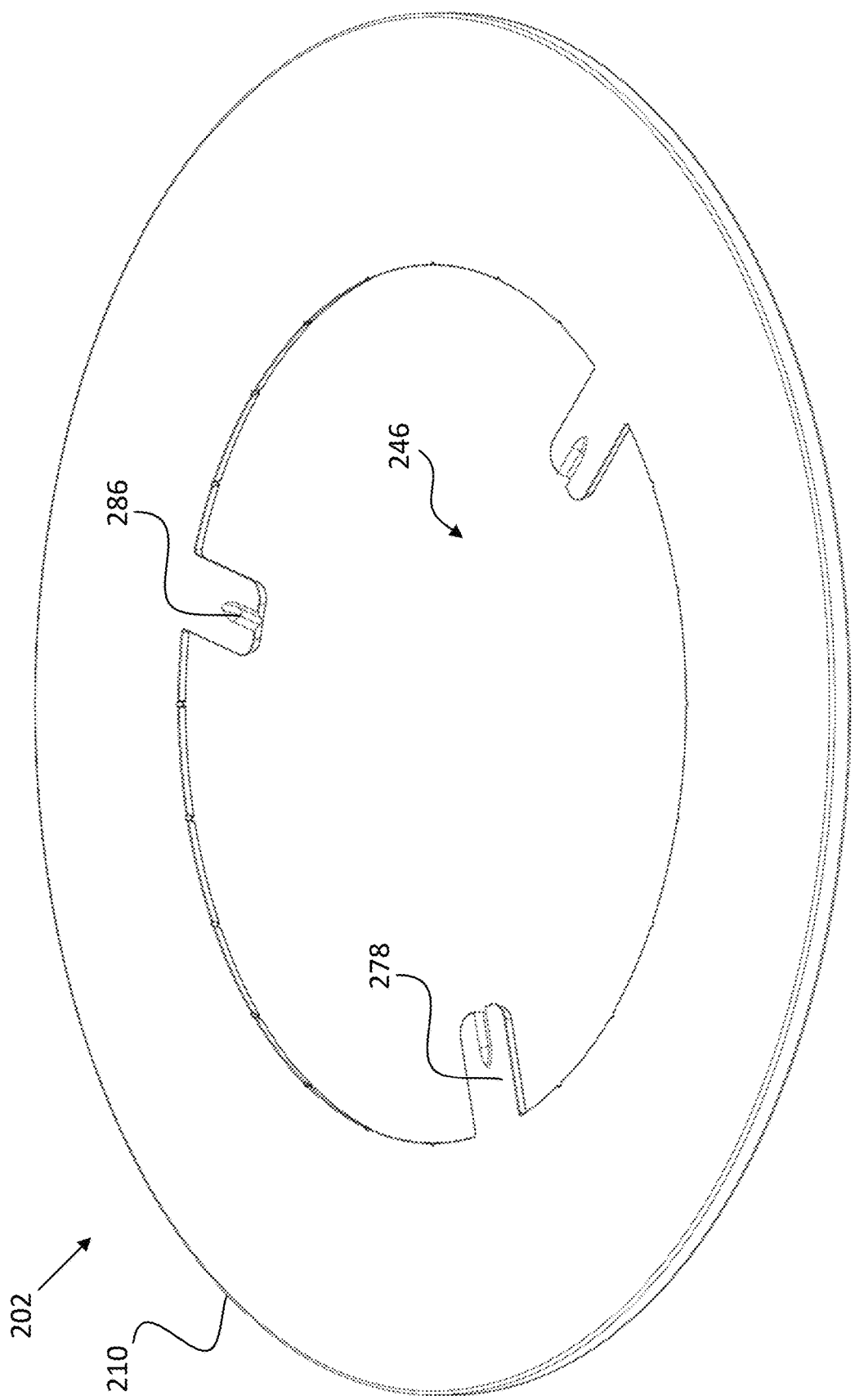
FIG. 14 shows a back view of the example outer susceptor of FIG. 8.

FIG. 12 shows a back surface of the example outer susceptor 202 of FIG. 11. The back surface 106 may be substantially flat and/or smooth. As shown, one or more support elements 278 may be included as noted above. The support elements 278 may include corresponding recesses 286 therein. The recesses 286 may be configured to receive corresponding protrusions from a susceptor support apparatus (not shown) to align, and prevent rotation and/or translation of the outer susceptor 202 relative to the apparatus, the inner susceptor 201, and/or the outer susceptor 202. Additional stabilizing elements (e.g., recesses, protrusions, etc.) may be included to prevent rotation of the outer susceptor 202 during deposition. FIGS. 13-14 show another example outer susceptor 202 having 24 channels instead of 48.

Figure 15:
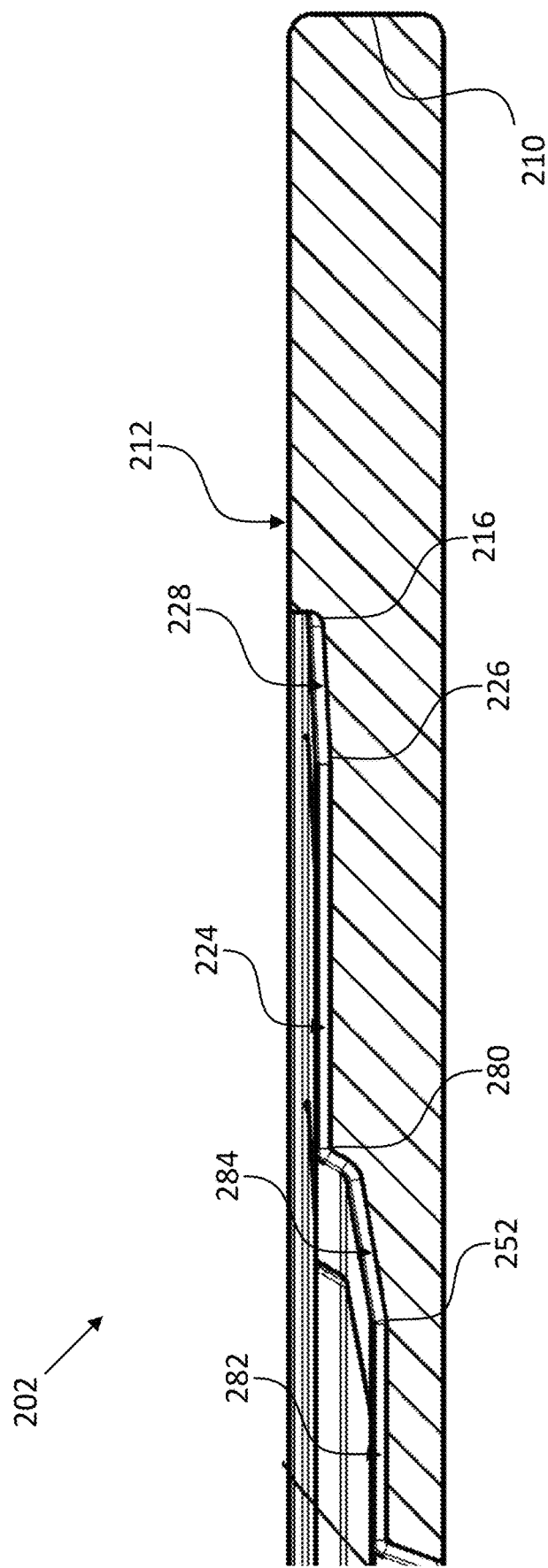
FIG. 15 shows a cross-sectional side view of the example outer susceptor shown in any of FIGS. 11-14.

FIG. 15 shows a cross-sectional side view of the example outer susceptor 202 shown in any of FIGS. 11-14. The various regions and boundaries of the outer susceptor 202 are shown. As shown, the rim region 212 and the back surface of the outer susceptor 202 may be substantially parallel to each other.

Figure 16:
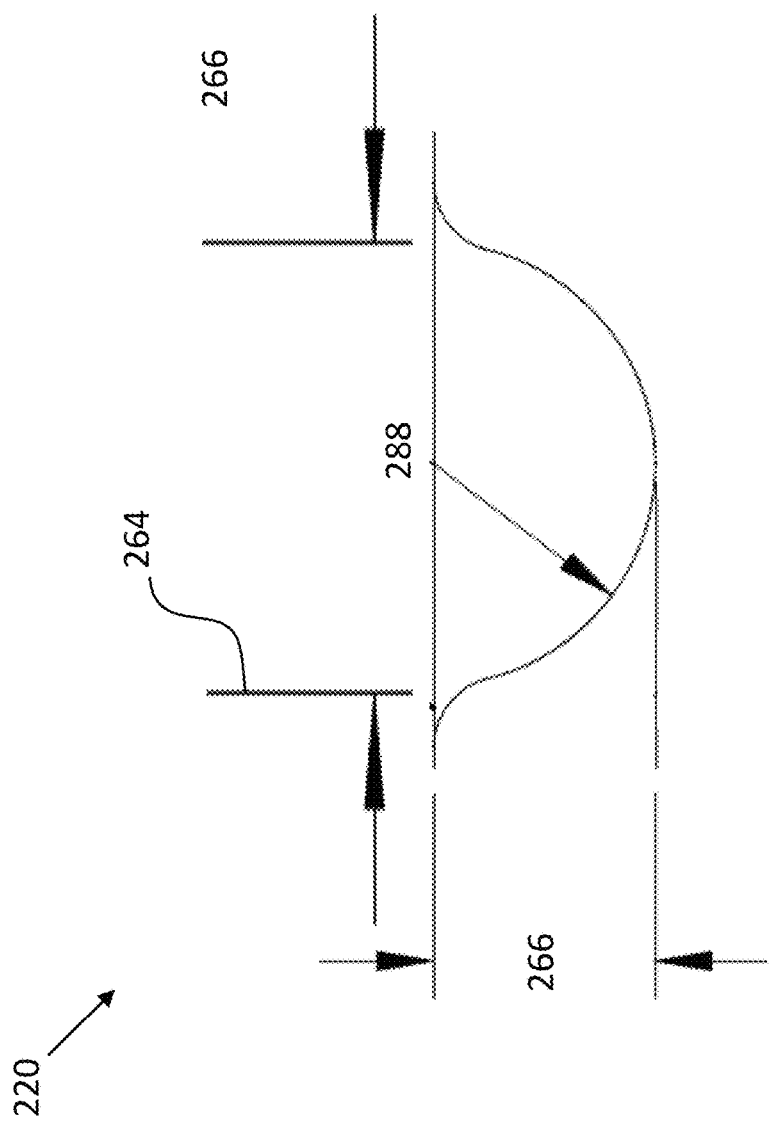
FIG. 16 shows a cross sectional view of an example channel.

FIG. 16 shows a cross sectional view of an example channel 220. Other shapes of the cross section are possible (such as those described with reference to the channels 120 above). As shown, the channel 220 can include curvilinear sidewalls. The sidewalls may form substantially a semicircle along the cross section. The radius 288 of curvature may be between about 0.1 mm and 2.5 mm and is about 0.6 mm in some embodiments. Curved sidewalls as shown may be helpful in preventing the accumulation of gas therein during deposition. The width 264 of the channel 220 may be between about 0.1 mm and 5 mm and in some embodiments is about 1.2 mm. The depth 266 of the channel 220 may be between about 0.05 mm and 1.5 mm and in some embodiments is about 0.6 mm.

Figure 17:
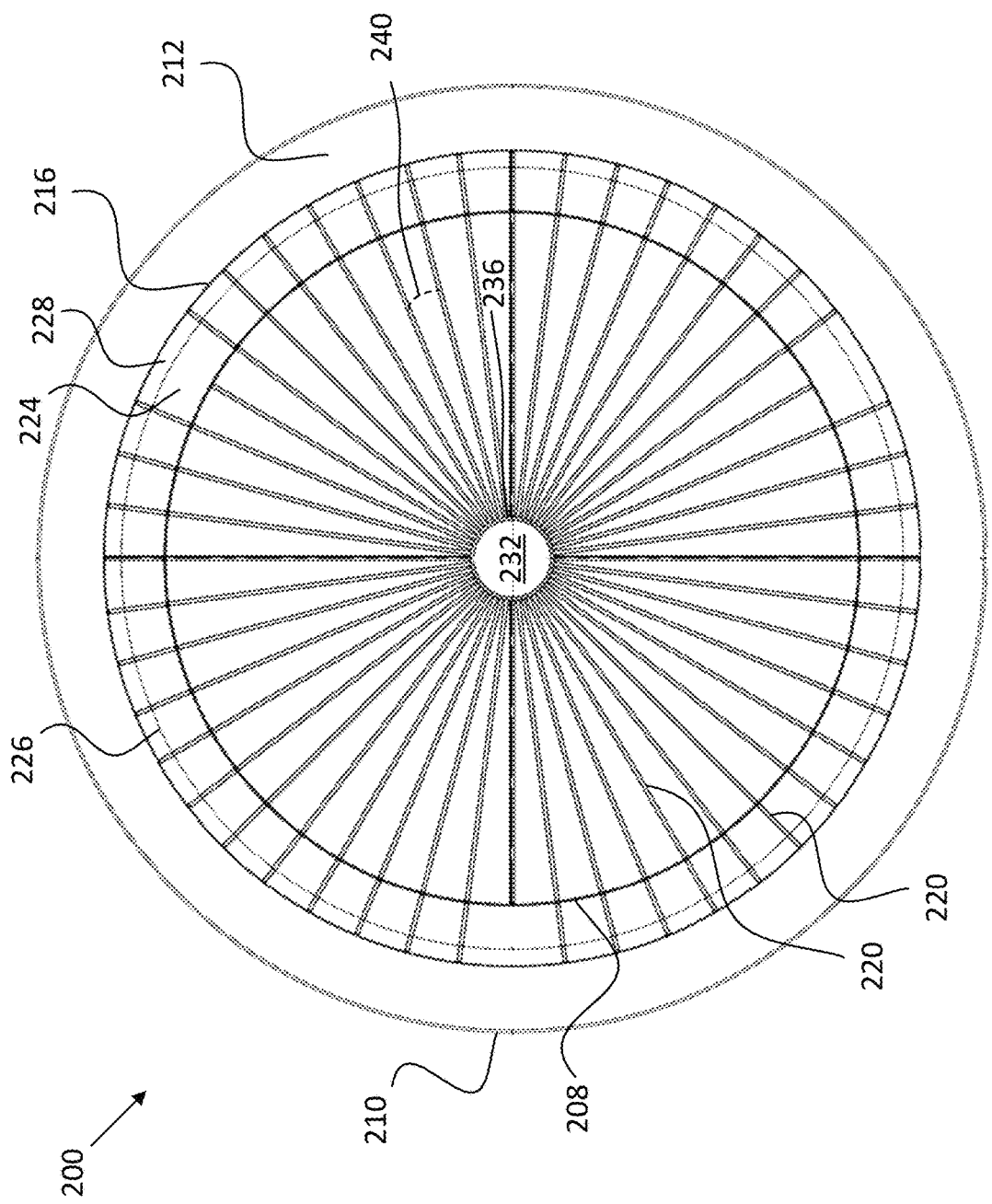
FIG. 17 shows a susceptor in an assembled state with the inner susceptor and the outer 202 together.
Figure 18:
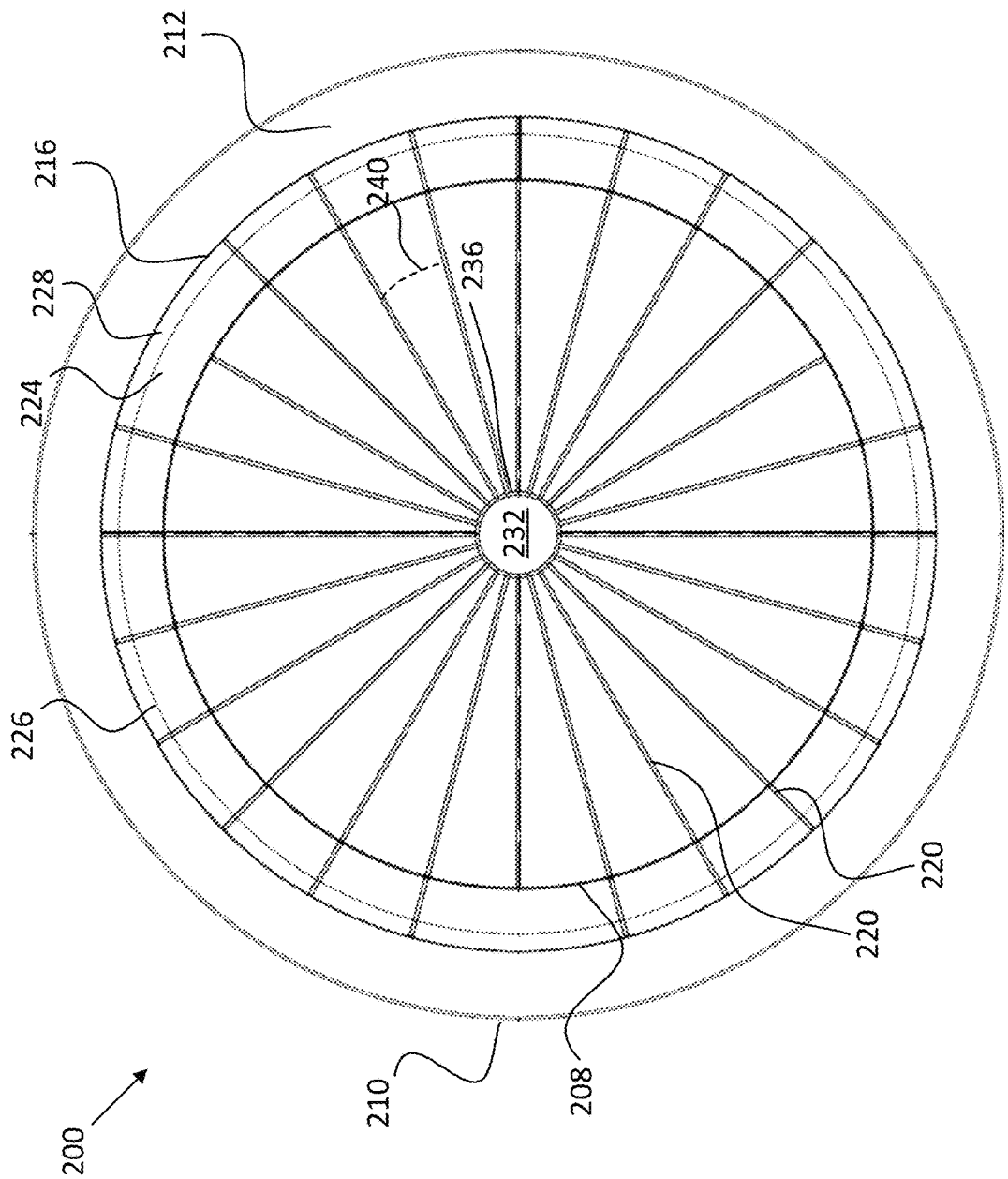
FIG. 18 shows another example embodiment of a susceptor in an assembled state.

FIG. 17 shows a susceptor 200 in an assembled state with the inner susceptor 201 and the outer susceptor 202 together. In the assembled state, the outer susceptor 202 may support the inner susceptor 201 as described above. As shown, one or more channels 220 of the inner susceptor 201 may connect and/or correspond to respective channels 220 of the outer susceptor 202, for example, so that the channels in the inner and outer susceptor are collinear or substantially radially aligned with respect to each other. Thus, the connected channels 220 may be referred to as single channels. FIG. 18 shows another example embodiment with fewer channels. The edge 208 of the inner susceptor 201 may substantially align with the region boundary 280 (not shown) such that the supported region is substantially covered in the assembled state. One or more elements of the susceptor 200 may comprise one or more materials, such as elemental or molecular materials. Such materials can include non-oxide ceramics, such as silicon carbide (SiC or CSi), graphite, or any other ceramic. Other materials may be used, such as metal. In some embodiments, one or more elements of the susceptor 200 may include a silicon carbide coating, such as silicon-carbide-coated graphite.

FIG. 19 shows a cross sectional side view of an example susceptor 200 such as that shown in FIGS. 17-18. Various regions and boundaries are depicted. As shown, the inner susceptor 201 may be supported by the inner support region 282 and/or the outer support region 284. In some embodiments, however, the inner susceptor 201 may not contact the outer susceptor 202 other than at the interface between the support elements 278 and corresponding recesses 268 and among other support/stabilizing elements (e.g., FIGS. 7-9 and 11-14). The face 204 of the inner susceptor 201 may be substantially coplanar with the inner channel region 224 in the assembled state, as shown. The substrate may be substantially supported by the outer channel region 228. The rim region 212 may be substantially parallel to the back surface 206 of the inner susceptor 201 in the assembled state.

The inner susceptor 201 and/or the outer susceptor 202 may be treated to improve performance. For example, one or more regions of the susceptors 201, 202 may be polished to reduce the likelihood of deformities (e.g., from sticking) to affect the substrate. As an example, the outer channel region 228 may be polished to reduce sticking of the edge of the substrate thereto. Portions of the inner susceptor 201 and/or outer susceptor 202 may be coated to improve performance, for example, with silicon carbide.

The inner susceptor 201 can have a variety of dimensions. The inner susceptor 201 and/or the outer susceptor 202 can each have a maximum thickness of between about 1 mm and 15 mm and in some embodiments is about 5.6 mm. The combined maximum thickness of the susceptor 200 in the assembled state can be between about 1 mm and 15 mm and in some embodiments is about 5.6 mm. The tapered portion 274 can have a maximum thickness of between about 1 mm and 15 mm and in some embodiments is about 2.3 mm. A diameter of the inner susceptor 201 may be between about 100 mm and 500 mm and in some embodiments is about 255 mm. A diameter of the outer susceptor 202 may be between about 150 mm and 600 mm and in some embodiments is about 350 mm. An inner diameter of the aperture 246 (e.g., as measured from the innermost portion of each support element 278) may be between about 35 mm and 400 mm and in some embodiments is about 160 mm.

FIG. 20 shows the cross sectional side view of FIG. 19 with an indication of fluid (e.g., gas) flow within the susceptor 200 in the assembled state. As shown, the fluid passes along the face 204 of the inner susceptor 201 radially outward and passes between the inner susceptor 201 and the outer susceptor 202. Ultimately, the fluid passes underneath the susceptor 200. Allowing trapped air to go below the susceptor 200 while preventing it from escaping radially can reduce leakage of the reactant and thus prevent depositing on the backside of the substrate. In some embodiments, vents underneath the susceptor 200 can be configured to prevent or reduce leakage from reaching the bottom of the susceptor 200.

The present aspects and implementations may be described in terms of functional block components and various processing steps. Such functional blocks may be realized by any number of hardware or software components configured to perform the specified functions and achieve the various results. For example, the present aspects may employ various sensors, detectors, flow control devices, heaters, and the like, which may carry out a variety of functions. In addition, the present aspects and implementations may be practiced in conjunction with any number of processing methods, and the apparatus and systems described may employ any number of processing methods, and the apparatus and systems described are merely examples of applications of the invention.

What is claimed is:

1. A susceptor comprising:
    a face configured to support a substrate thereon;
    an outer edge forming an outer perimeter around the face;
    a back surface opposite the face, wherein the face comprises:
        a channel region positioned between the outer edge and a center of the face; and
        a plurality of channels disposed within the channel region and extending radially relative to the center of the face; and
    one or more apertures extending between the face and the back surface, the one or more apertures configured to allow for pins to extend therethrough and lift a substrate from the face of the susceptor, the one or more apertures disposed within the channel region,
    wherein each of the plurality of channels is substantially straight in a radial direction,
    wherein an angular separation between first and second channels of the plurality of channels is greater than an angular separation between the second channel and a third channel of the plurality of channels, and
    wherein the first channel is radially consecutive with the second channel and the second channel is radially consecutive with the third channel.

2. The susceptor of claim 1, wherein the face further comprises a radially extending substantially flat and smooth rim region between the outer edge and an outer radial boundary of the channel region, wherein the outer radial boundary is radially outward of the substrate when the substrate is supported, and wherein each of the plurality of channels extends radially to the outer radial boundary.

3. The susceptor of claim 1, wherein a cross section of at least one of the plurality of channels comprises:
first and second sidewalls, each of the first and second sidewalls being substantially flat, wherein the first and second sidewalls are disposed at an acute angle relative to each other.

4. The susceptor of claim 1, wherein the angular separation between the first and second channels is at least about 50% greater than the angular separation between the second and third channels.

5. The susceptor of claim 4, wherein the one or more apertures is disposed between the first and second channels.

6. The susceptor of claim 1, wherein the one or more apertures comprises at least three apertures, and wherein an angular separation between each radially consecutive aperture of the at least three apertures is substantially equal.

7. The susceptor of claim 1, wherein a number of channels within the channel region of the face is between 15 and 30.

8. A susceptor comprising:
a face configured to support a substrate thereon;
an outer edge forming an outer perimeter around the face;
a back surface opposite the face, wherein the face comprises:
 a channel region positioned between the outer edge and a center of the face; and
 a plurality of channels disposed within the channel region and extending radially relative to the center of the face between an inner radial boundary and an outer radial boundary of the channel region, each of the plurality of channels extending from the inner radial boundary to the outer radial boundary; and
a radially extending substantially flat and smooth rim region between the outer edge and the outer radial boundary of the channel region,
wherein an angular separation between first and second channels of the plurality of channels is greater than an angular separation between the second channel and a third channel of the plurality of channels, and
wherein the first channel is radially consecutive with the second channel and the second channel is radially consecutive with the third channel.

9. The susceptor of claim 1, further comprising:
a substantially smooth inner region of the face extending radially to an inner radial boundary; and
a radially extending substantially flat and smooth rim region radially inward of the outer edge and extending from the outer edge to an outer radial boundary;
wherein:
 the channel region is further positioned between the outer radial boundary and the inner radial boundary;
 the channel region comprises an outer channel region and an inner channel region;
 the outer channel region has an elevated and inclined portion relative to the inner channel region;
 the outer channel region is configured to support the substrate; and
 each of the plurality of channels extends from the inner radial boundary to the outer radial boundary.

10. The susceptor of claim 9, wherein the outer radial boundary comprises a first outer radial boundary and a second outer radial boundary, a profile of the face of the susceptor being non-smooth between the first and second outer radial boundaries.

11. The susceptor of claim 8, further comprising:
a substantially smooth inner region of the face extending radially to the inner radial boundary;
wherein:
 the channel region is further positioned between the outer radial boundary and the inner radial boundary;
 the channel region comprises an outer channel region and an inner channel region;
 the outer channel region has an elevated and inclined portion extending from the highest portion of the inner channel region; and
 the outer channel region configured to support the substrate.

12. The susceptor of claim 11, wherein the outer radial boundary comprises a first outer radial boundary and a second outer radial boundary, a profile of the face of the susceptor being non-smooth between the first and second outer radial boundaries.

13. The susceptor of claim 1, wherein the channel region includes an inner channel region and an outer channel region, wherein the outer channel region is configured to support an edge or rim of the substrate, and wherein the plurality of channels each circumferentially overlap the one or more apertures and radially span the outer channel region of the face of the susceptor.

14. The susceptor of claim 8, wherein the inner radial boundary is formed by a difference in elevation between an inner region extending from the center of the face to the inner radial boundary and an inner portion of the channel region bordering the inner radial boundary.

* * * * *